(12) United States Patent
Ishigaki et al.

(10) Patent No.: US 9,241,410 B2
(45) Date of Patent: Jan. 19, 2016

(54) WIRED CIRCUIT BOARD AND PRODUCING METHOD THEREOF

(75) Inventors: Saori Ishigaki, Osaka (JP); Jun Ishii, Osaka (JP); Yoshito Fujimura, Osaka (JP); Yuu Sugimoto, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 143 days.

(21) Appl. No.: 13/485,274

(22) Filed: May 31, 2012

(65) Prior Publication Data

US 2013/0014976 A1    Jan. 17, 2013

Related U.S. Application Data

(60) Provisional application No. 61/457,905, filed on Jul. 5, 2011, provisional application No. 61/688,299, filed on May 11, 2012.

(30) Foreign Application Priority Data

May 31, 2011  (JP) ................................. 2011-121280
Mar. 23, 2012  (JP) ................................. 2012-067717

(51) Int. Cl.
*H05K 1/16* (2006.01)
*H05K 1/18* (2006.01)
*H05K 3/32* (2006.01)
*G11B 5/48* (2006.01)

(52) U.S. Cl.
CPC ............... *H05K 1/189* (2013.01); *H05K 3/321* (2013.01); *G11B 5/484* (2013.01); *G11B 5/4853* (2013.01); *G11B 5/4873* (2013.01); *H05K 2201/0385* (2013.01); *H05K 2201/053* (2013.01); *H05K 2201/09072* (2013.01); *H05K 2201/10083* (2013.01)

(58) Field of Classification Search
CPC .............. H05K 1/02; H05K 1/18; H05K 3/32
USPC .................... 361/679.33, 727, 756, 801, 802; 174/250, 255, 260–262
See application file for complete search history.

(56) References Cited

U.S. PATENT DOCUMENTS

| 6,412,702 B1 * | 7/2002 | Ishikawa et al. | ............... 235/492 |
| 7,280,319 B1 * | 10/2007 | McNab | ....................... 360/294.4 |
| 7,359,158 B2 * | 4/2008 | Takikawa et al. | ........... 360/244.8 |

(Continued)

FOREIGN PATENT DOCUMENTS

| JP | 2010251619 | * 11/2010 |
| JP | 2011-081861 | 4/2011 |

(Continued)

OTHER PUBLICATIONS

Notification of Reasons for Refusal issued by the Japanese Office Action on Jul. 7, 2015 in connection with JP 2012-067717.

*Primary Examiner* — Yuriy Semenenko
(74) *Attorney, Agent, or Firm* — Jean C. Edwards, Esq.; Edwards Neils PLLC

(57) ABSTRACT

A wired circuit board includes an insulating layer, and a conductive layer including a wire covered with the insulating layer and a terminal continued to the wire to electrically connect the wire to an electronic element. The insulating layer is formed with an insulating opening exposing the terminal, and the terminal is formed in a pattern which is indented in a thickness direction.

7 Claims, 26 Drawing Sheets

(56) References Cited

U.S. PATENT DOCUMENTS

| | | | |
|---|---|---|---|
| 7,440,236 B1 * | 10/2008 | Bennin et al. | 360/294.4 |
| 2002/0089793 A1 * | 7/2002 | Nakagawa et al. | 360/294.4 |
| 2003/0161073 A1 * | 8/2003 | Horie et al. | 360/244.2 |
| 2010/0067151 A1 * | 3/2010 | Okawara et al. | 360/294 |
| 2010/0220457 A1 * | 9/2010 | Mukae et al. | 361/803 |
| 2012/0014017 A1 | 1/2012 | Ohnuki et al. | |
| 2013/0248233 A1 * | 9/2013 | Kanezaki et al. | 174/260 |

FOREIGN PATENT DOCUMENTS

| | | |
|---|---|---|
| JP | 2011-082302 | 4/2011 |
| JP | 2012-022756 | 2/2012 |

* cited by examiner

FIG.14
(a)
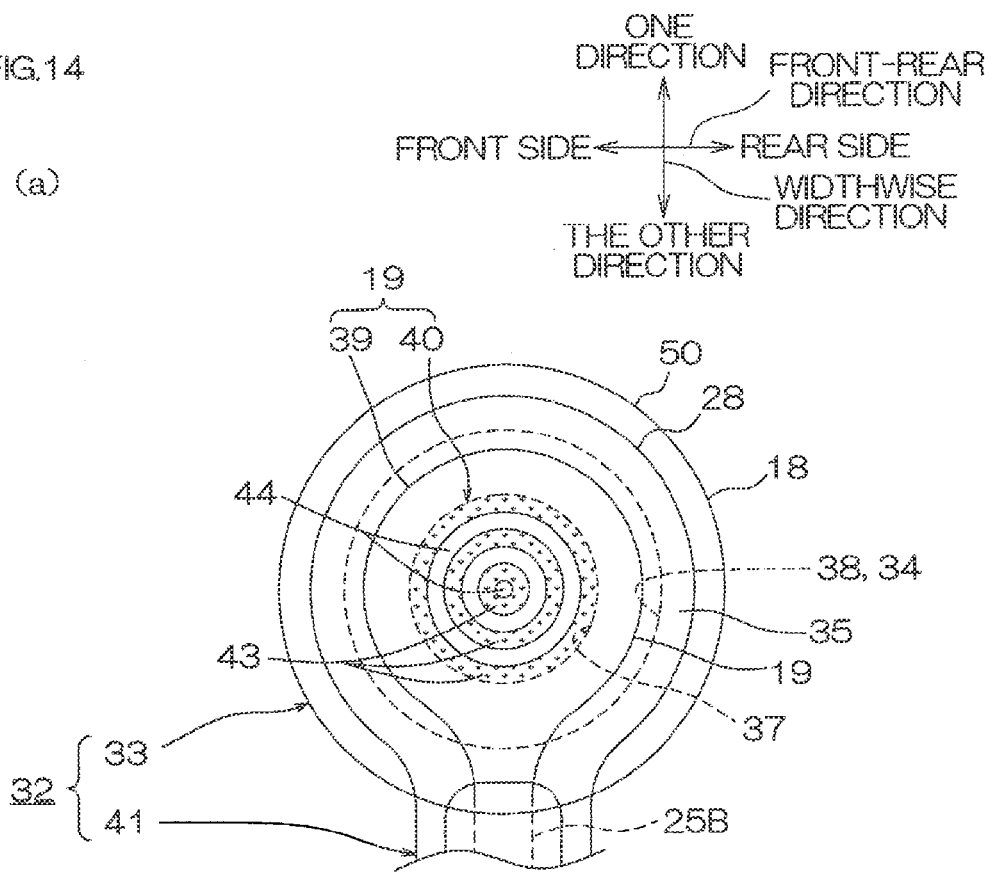
(b)
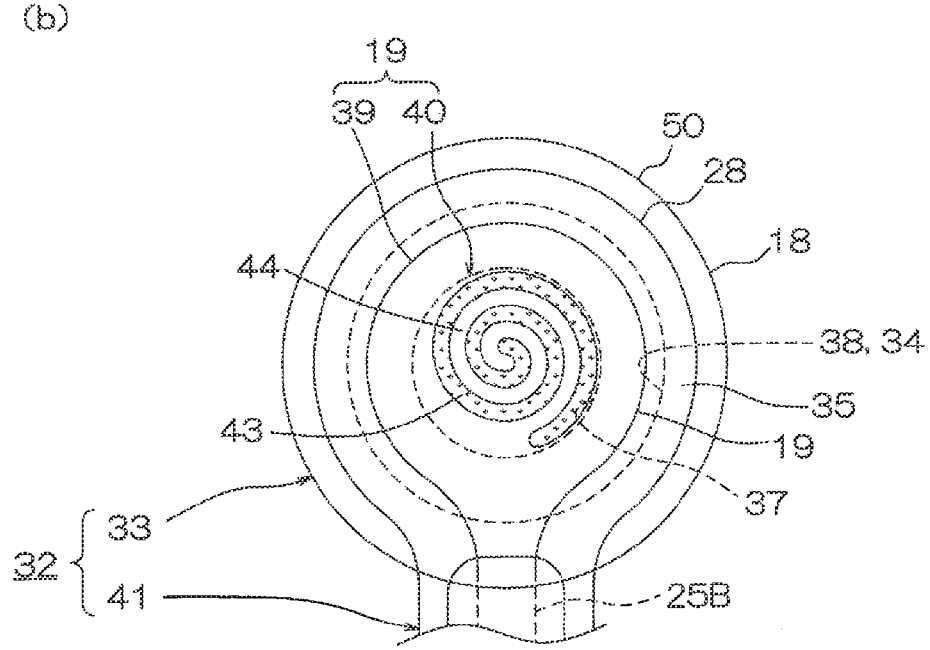

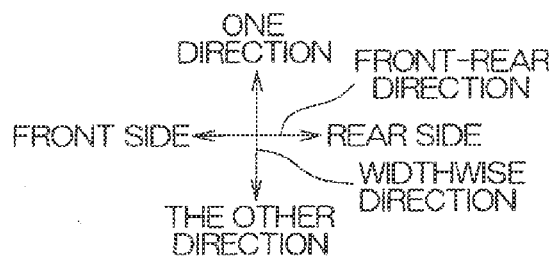
FIG.15
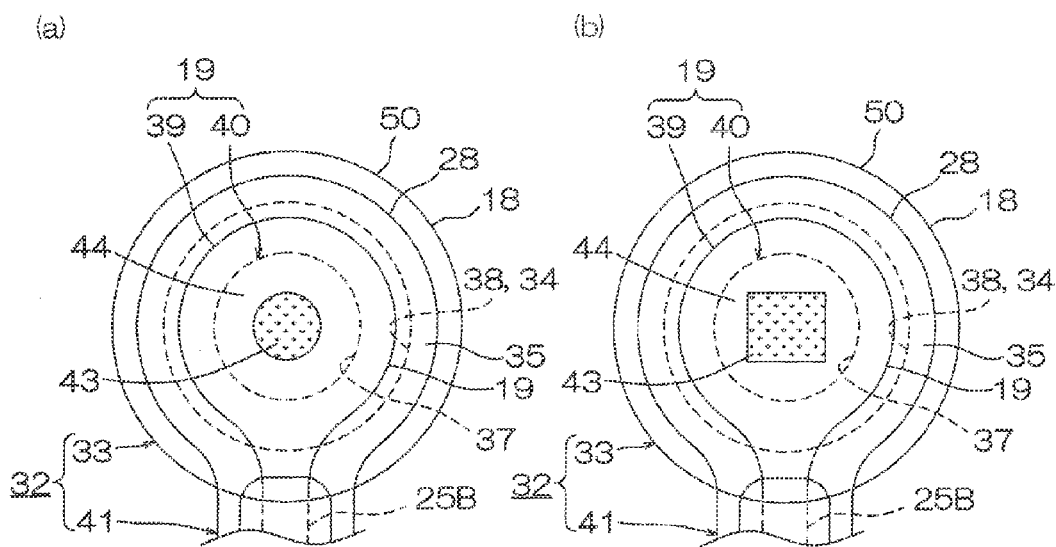
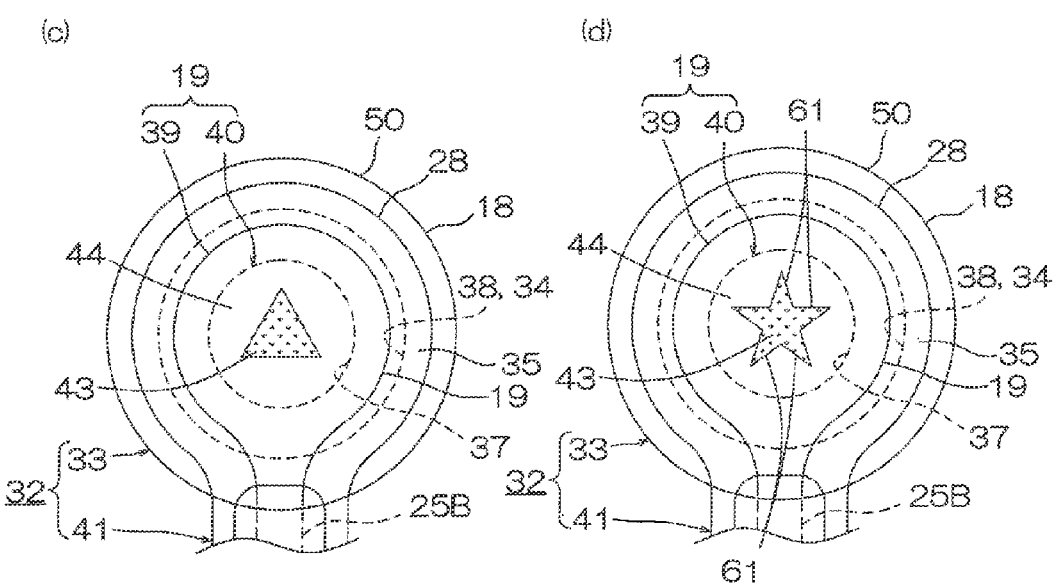

FIG.17
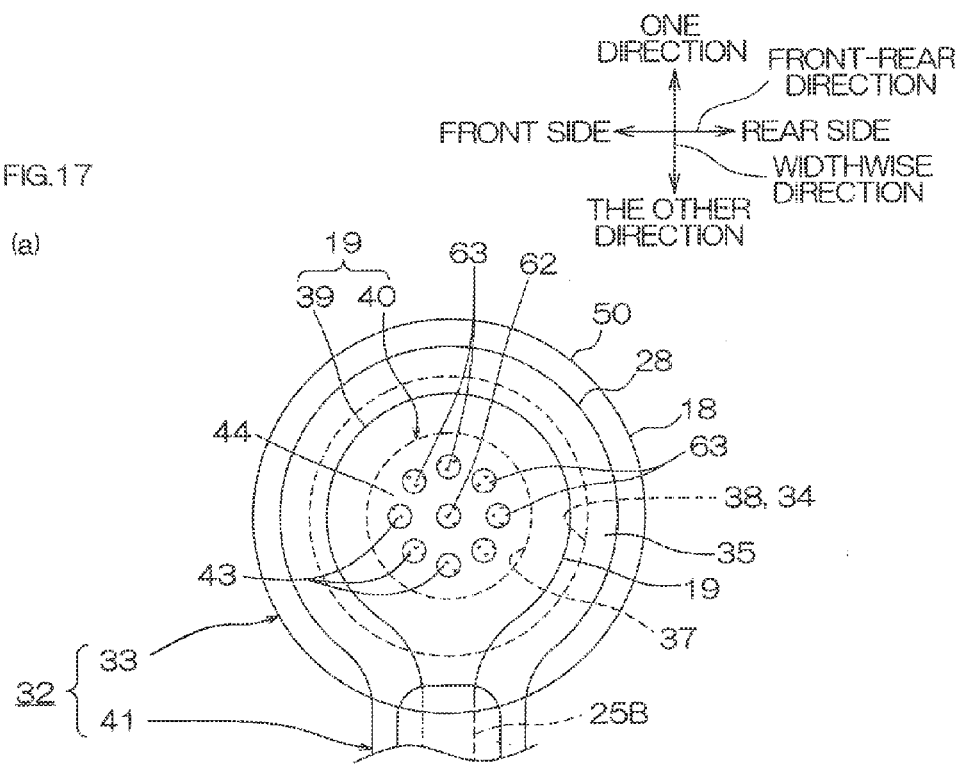
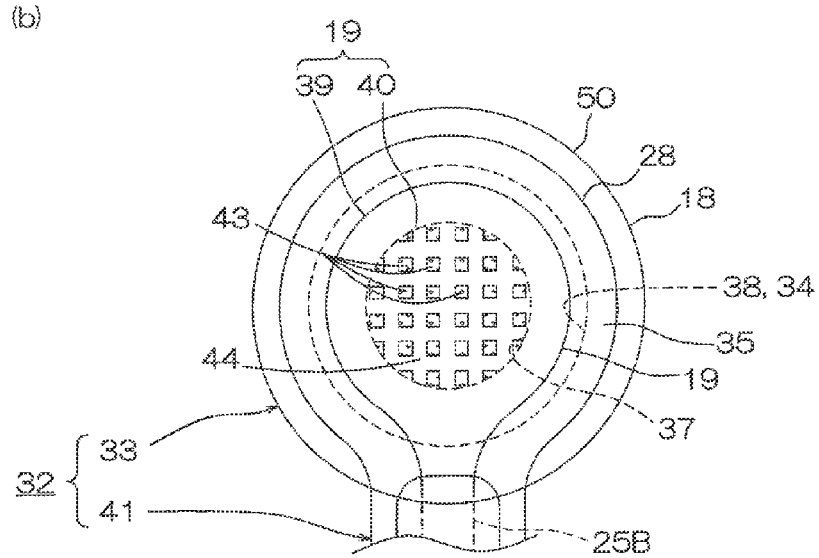

FIG.18
(a)
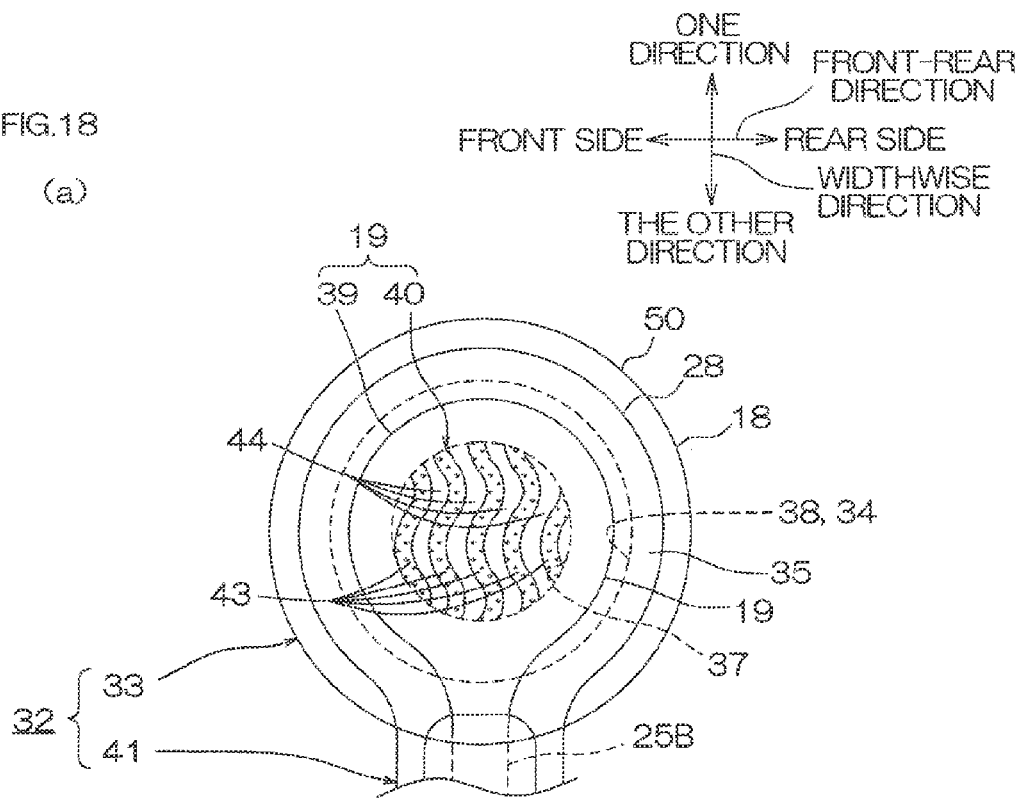
(b)
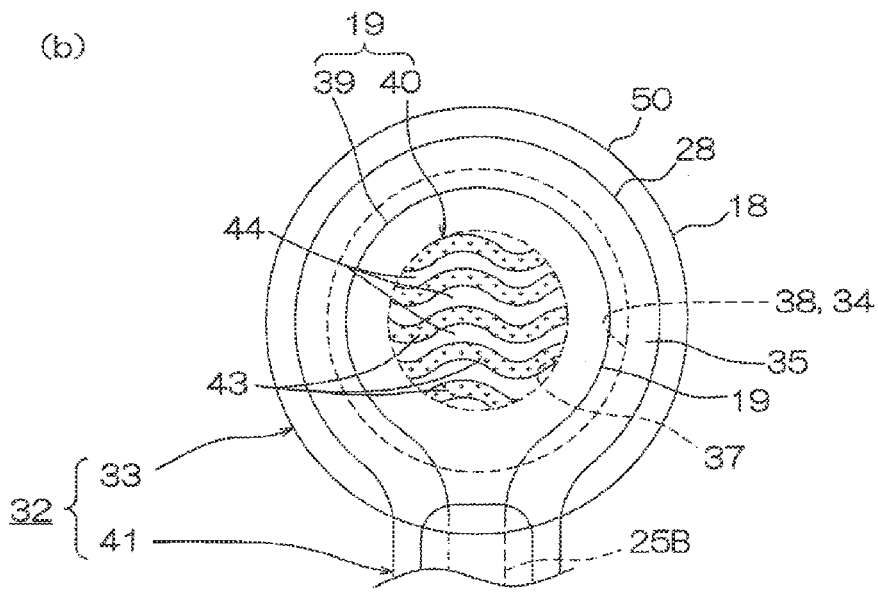

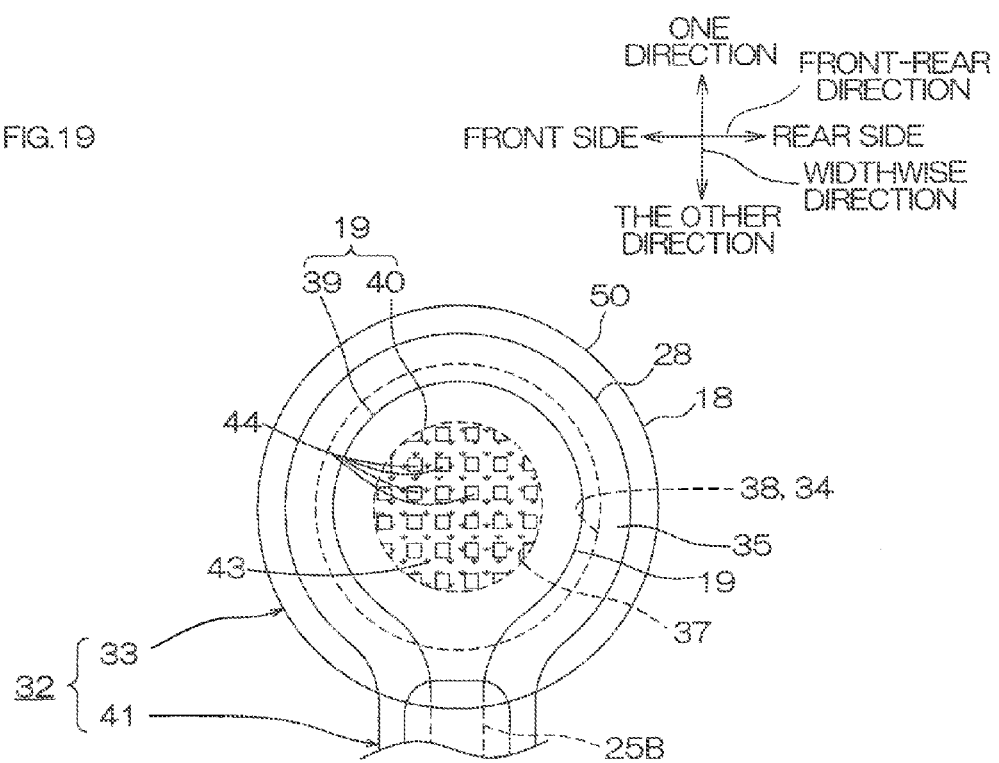

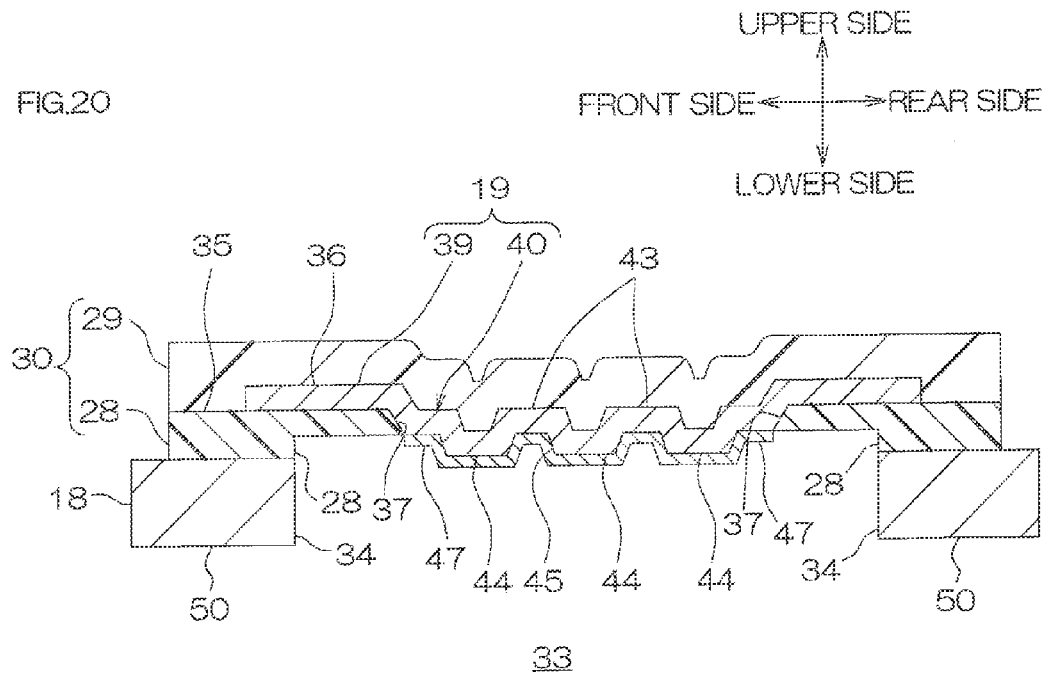
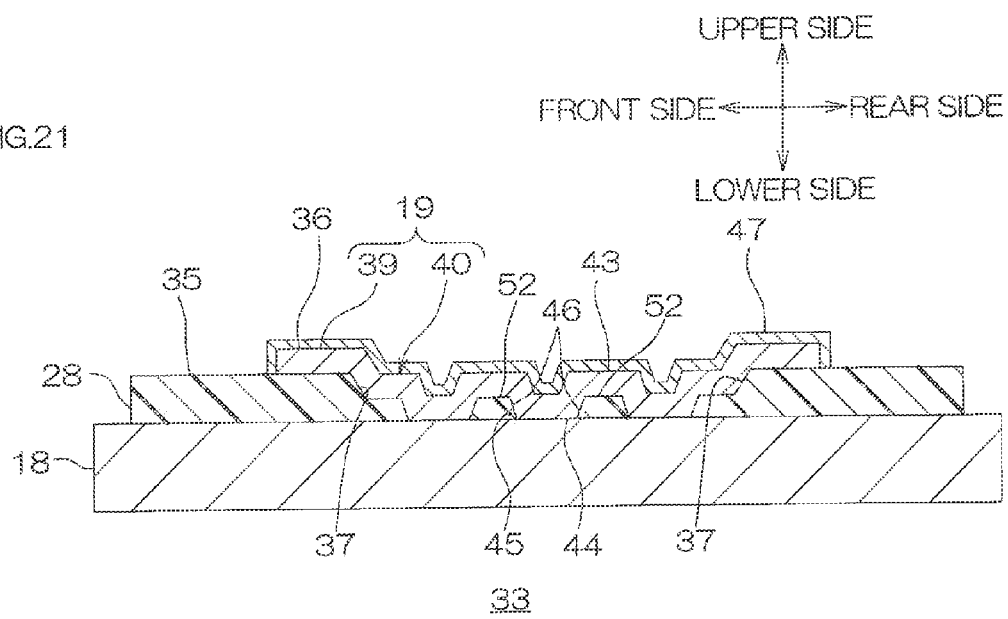

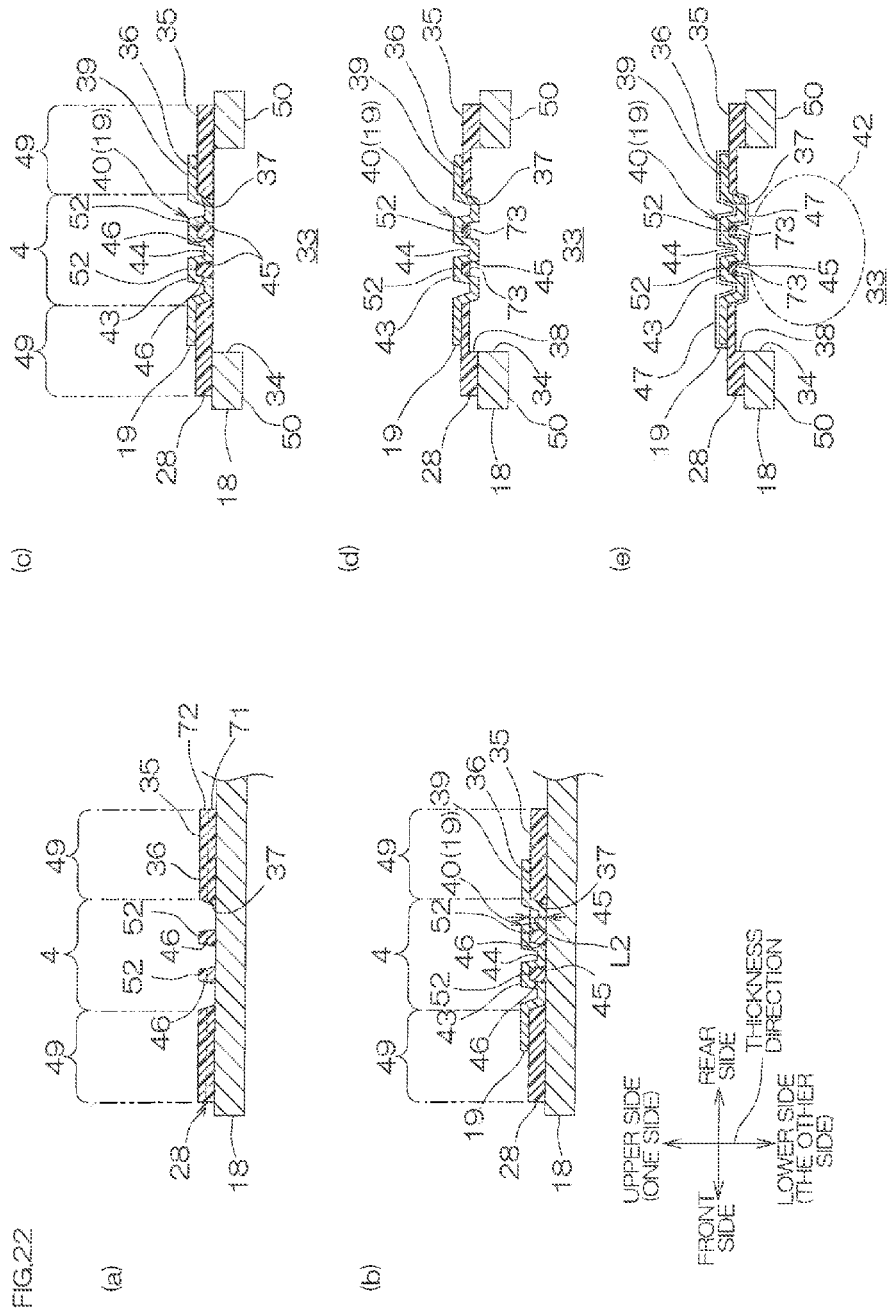

FIG.23
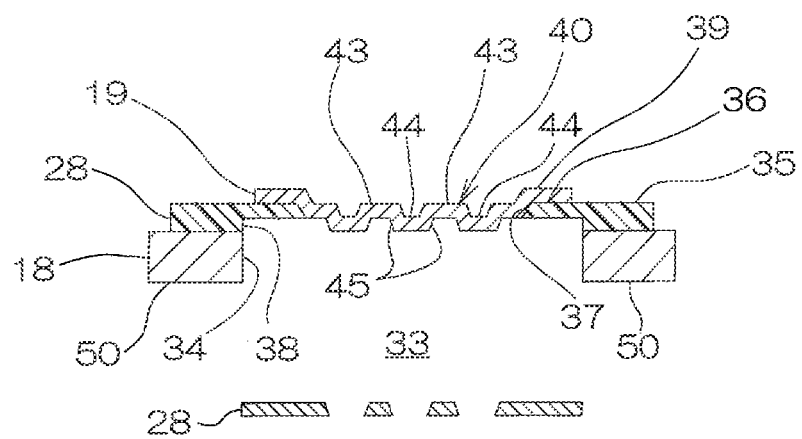
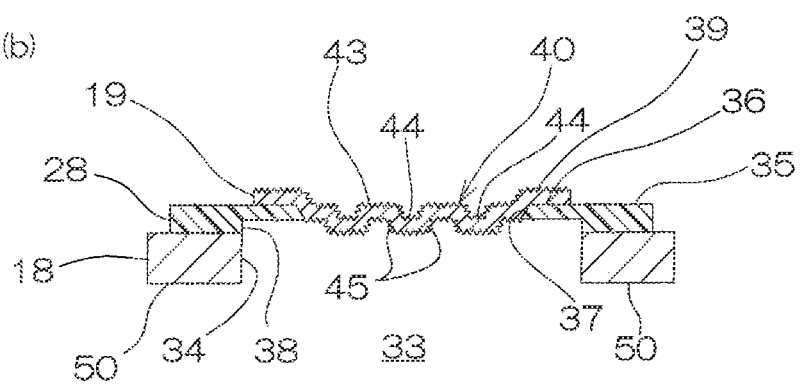
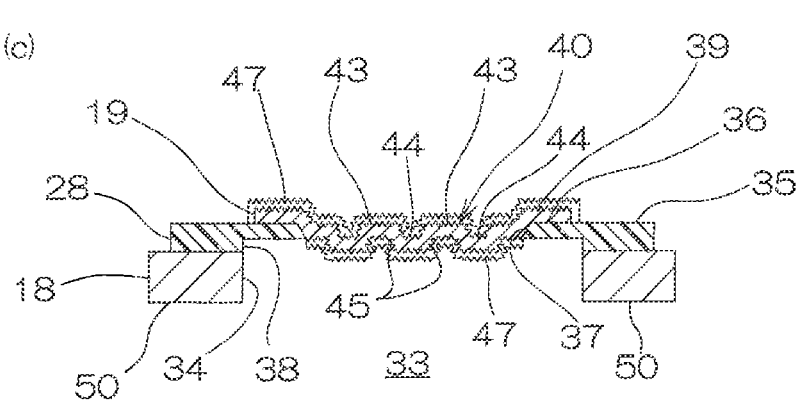

WIRED CIRCUIT BOARD AND PRODUCING METHOD THEREOF

CROSS-REFERENCE TO RELATED APPLICATION

The present application claims the benefit of U.S. Provisional Applications No. 61/457,905 filed on Jul. 5, 2011 and U.S. Provisional Applications No. 61/688,299 filed on May 11, 2012, and claims priority from Japanese Patent Applications No. 2011-121280 filed on May 31, 2011 and Japanese Patent Applications No. 2012-067717 filed on Mar. 23, 2012, the contents of which are hereby incorporated by reference into this application.

BACKGROUND OF THE INVENTION

1. Field of the Invention

The present invention relates to a wired circuit board and a producing method thereof, and particularly to a wired circuit board used appropriately for a suspension board with circuit which is mounted in a hard disk drive and a producing method thereof.

2. Description of the Related Art

A suspension board with circuit includes a metal supporting board, an insulating base layer formed thereon, and a conductive layer formed thereon and having head-side terminals for connecting to a magnetic head. On the suspension board with circuit, the magnetic head is mounted and connected to the head-side terminals. With the metal supporting board being supported on a load beam, the suspension board with circuit is mounted in a hard disk drive.

In recent years, it has been examined to connect such a suspension board with circuit to various electronic elements such as, e.g., a piezo element (piezoelectric element) and accurately and finely adjust the position and angle of a magnetic head. Since such an electronic element has relatively low heat resistance, it is necessary to electrically connect the electronic element to electronic-element-side terminals (terminals formed on a conductive layer and different from head-side terminals) at a relatively low temperature via a conductive adhesive or the like.

Low-temperature connection provided between the electronic element having low heat resistance and the electronic-side terminals via the conductive adhesive is lower in the strength of connection between the conductive adhesive and the electronic-side terminals than high-temperature connection provided therebetween via a molten solder. Accordingly, it has been required to sufficiently improve such connection strength.

To satisfy the requirement, it has been proposed to provide grooves (through grooves) in a circular 1 and along a circumferential direction thereof, which are formed to extend through the circular 1 and in a thickness direction thereof (see, e.g., Japanese Unexamined Patent No. 2010-251619). In the wired board described in Japanese Unexamined Patent No. 2010-251619, a conductive paste is in contact with the upper surface of the 1 and, while filling the grooves. Since the upper surface of the land and the inner side surfaces of the grooves are in contact with the conductive paste, the land has an increased contact area with the conductive paste and improved adhesion thereto.

SUMMARY OF THE INVENTION

However, in the wired circuit board of Japanese Unexamined Patent No. 2010-251619, only the upper surface of the land and the inner side surfaces of the grooves are in contact with the conductive paste. This results in the problem that it is impossible to further sufficiently increase the contact area between the land and the conductive paste and sufficiently improve the adhesion therebetween.

On the other hand, a tentative method is proposed which performs a surface roughening treatment on the electronic-element-side terminals to improve the adhesion between the conductive adhesive and the electronic-element-side terminals by an anchor effect. However, in such a method, it is necessary to add an extra step of performing the surface roughening treatment on the electronic-element-side terminals, which results in the problem of accordingly increased time and labor and increased production cost.

It is therefore an object of the present invention to provide a wired circuit board which allows a sufficient improvement in the reliability of connection between an electronic element and a terminal and a producing method of a wired circuit board which allows such a wired circuit board to be easily produced at low cost.

A wired circuit board of the present invention includes an insulating layer, and a conductive layer including a wire covered with the insulating layer and a terminal, which is continued to the wire, for being electrically connected to an electronic element, wherein the insulating layer is formed with an insulating opening exposing the terminal, and the terminal is formed in a pattern which is indented in a thickness direction.

In the wired circuit board of the present invention, it is preferable that the terminal is used by connecting to the electronic element via a conductive adhesive.

In the wired circuit board of the present invention, it is also preferable that the insulating layer includes an insulating base layer formed at one side of the wire in the thickness direction, and the insulating opening is formed so as to expose one-side surface of the terminal in the thickness direction in the insulating base layer. It is also preferable that the wired circuit board of the present invention further includes a metal supporting board formed at one side of the insulating base layer in the thickness direction, and supported on a support plate to which the electronic element is attached, and the metal supporting board is formed with a support opening exposing the one-side surface of the terminal in the thickness direction.

In the wired circuit board of the present invention, it is also preferable that the insulating layer includes an insulating cover layer formed at the other side of the wire in the thickness direction, and the insulating opening is formed so as to expose the other-side surface of the terminal in the insulating cover layer.

In the wired circuit board of the present invention, it is preferable that the electronic element is a piezoelectric element.

A method of producing a wired circuit board of the present invention includes the steps of preparing a metal supporting board, forming an insulating base layer at one side of the metal supporting board in a thickness direction thereof such that a terminal formation region including a pattern opening exposing the metal supporting board with a pattern shape and a pattern insulating portion defined by the pattern opening is formed therein, forming a conductive layer such that the conductive layer includes a wire formed at one side of the insulating base layer in the thickness direction and a terminal formed in the terminal formation region to be continued to the wire, and forming a support opening and a base opening each corresponding to the terminal formation region respectively in the metal supporting board and the insulating layer to form the terminal into a pattern which is exposed from each of the support opening and the base opening and indented in the thickness direction.

EFFECTS OF THE INVENTION

In the wired circuit board of the present invention, the terminal is formed in the pattern indented in the thickness direction. Accordingly, it is possible to sufficiently increase a contact area between the terminal and a connecting medium for connecting an electronic element thereto.

This allows a sufficient improvement in the reliability of connection between the terminal and the electronic element.

According to the method of producing the wired circuit board of the present invention, the insulating base layer is formed on one side of the metal supporting board in the thickness direction such that the terminal formation region including the pattern opening exposing the metal supporting board in the pattern shape and the pattern insulating portion defined by the pattern opening is formed therein. Consequently, by then forming the terminal in the terminal formation region and subsequently forming the support opening and the base opening each corresponding to the terminal formation region respectively in the metal supporting board and the insulating base layer, the terminal can be formed in the pattern exposed from each of the support opening and the base opening and indented in the thickness direction.

Therefore, it is possible to form the terminal in the pattern indented in the thickness direction, while saving time and labor required in adding the extra step of performing a surface roughening treatment on the terminal.

As a result, a wired circuit board excellent in the reliability of connection with an electronic element can be easily obtained at low cost.

BRIEF DESCRIPTION OF THE DRAWINGS

FIG. 14 shows an enlarged plan view of a pad portion of a suspension board with circuit as another embodiment of the wired circuit board of the present invention,
(a) illustrating a form in which a pattern has a generally annular plan view shape, and
(b) illustrating a form in which a pattern has a generally spiral plan view shape.

FIG. 15 is an enlarged plan view of a pad portion (a form in which a pattern is formed into a mark) of a suspension board with circuit as another embodiment of the wired circuit board of the present invention,
(a) illustrating a form in which a pattern has a generally circular plan view shape,
(b) illustrating a form in which a pattern has a generally rectangular plan view shape,
(c) illustrating a form in which a pattern has a generally triangular plan view shape, and
(d) illustrating a form in which a pattern has a generally star-like plan view shape.

FIG. 17 is an enlarged plan view of a pad portion (form in which a pattern has a generally scattered plan view shape) of a suspension board with circuit as another embodiment of the wired circuit board of the present invention,
(a) illustrating a form in which each upper wall has a generally circular plan view shape, and
(b) illustrating a form in which each upper wall has a generally rectangular plan view shape.

FIG. 18 is an enlarged plan view of a pad portion (form in which a pattern has a generally wave plan view shape) of a suspension board with circuit as another embodiment of the wired circuit board of the present invention,
(a) illustrating a form in which the pattern is along the widthwise direction,
(b) illustrating a form in which a pattern is along front-rear direction.

FIG. 19 shows an enlarged plan view of an embodiment in which in the pad portion shown in FIG. 17(b), the pattern of the upper wall and the pattern of the lower wall were interchanged.

FIG. 20 shows a cross-sectional view of a pad portion (form in which the insulating cover layer is formed in the pad portion) of a suspension board with circuit as another embodiment of the wired circuit board of the present invention.

FIG. 21 shows a cross-sectional view of a pad portion (form in which the metal supporting board is formed in a generally circular plan view shape) of a suspension board with circuit as another embodiment of the wired circuit board of the present invention.

FIG. 22 is a process view illustrating a producing method of a suspension board with circuit as another embodiment of the wired circuit board of the present invention,
(a) illustrating a step of forming an insulating base layer from a first insulating base layer and a second insulating base layer,
(b) illustrating a step of forming a conductive layer,
(c) illustrating a step of forming a support opening,
(d) illustrating a step of forming a first base opening and a second base opening, and
(e) illustrating a step of forming a protective thin film.

FIG. 23 is an enlarged plan view of a pad portion (form in which the upper wall, the lower wall, and the connecting wall are formed into a fine indented pattern) of a suspension board with circuit as another embodiment of the wired circuit board of the present invention,
(a) illustrating a step of forming a first base opening and a second base opening,
(b) illustrating a step of forming a fine indented pattern in the piezoelectric-side terminal,
(c) illustrating a step of forming a protective thin film.

EMBODIMENT OF THE INVENTION

Figure 1:
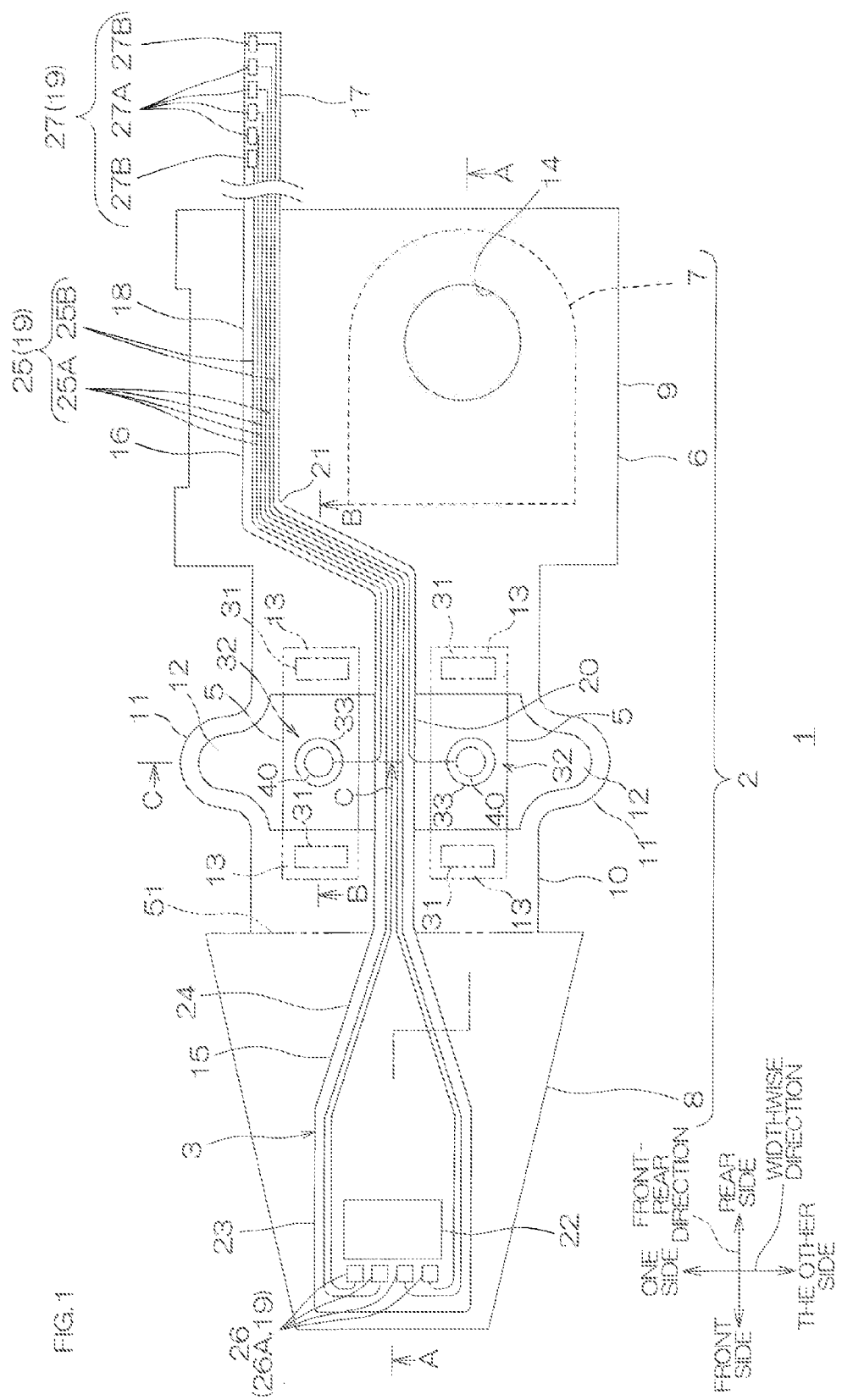
FIG. 1 shows a plan view of an assembly including a suspension board with circuit as an embodiment of a wired circuit board of the present invention.
Figure 2:
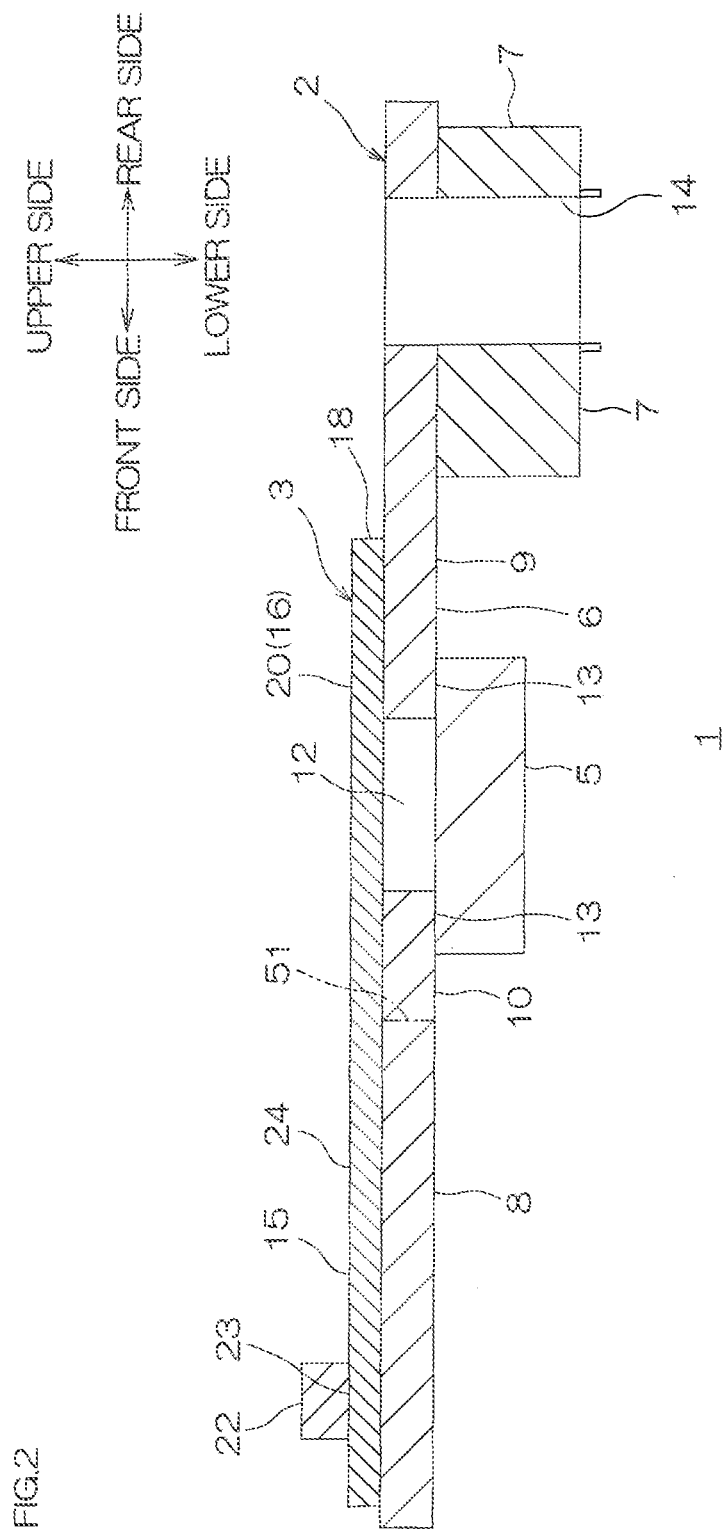
FIG. 2 shows a cross-sectional view of the assembly shown in FIG. 1, which is taken along the line A-A.
Figure 3:
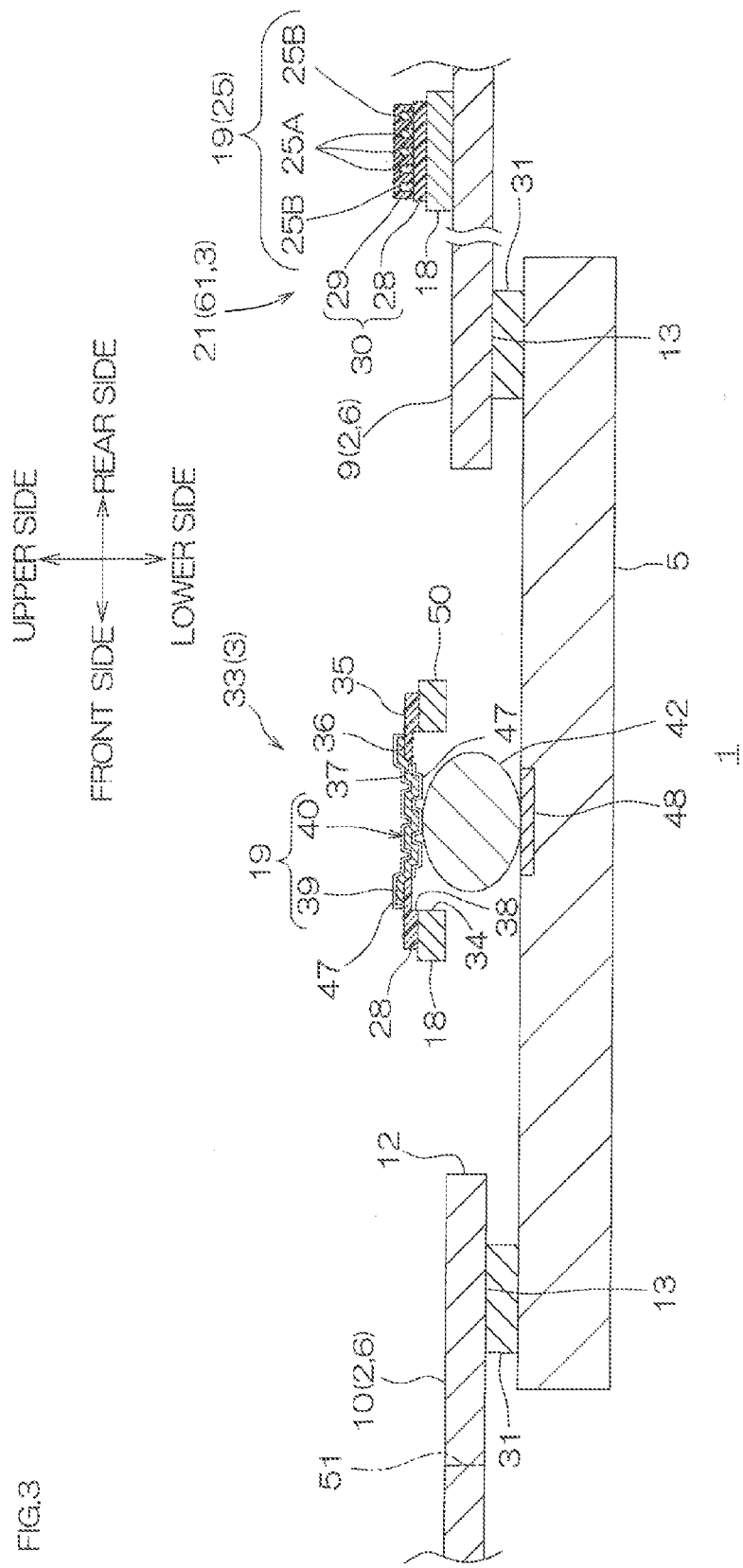
FIG. 3 shows a cross-sectional view of the assembly shown in FIG. 1, which is taken along the line B-B.
Figure 4:
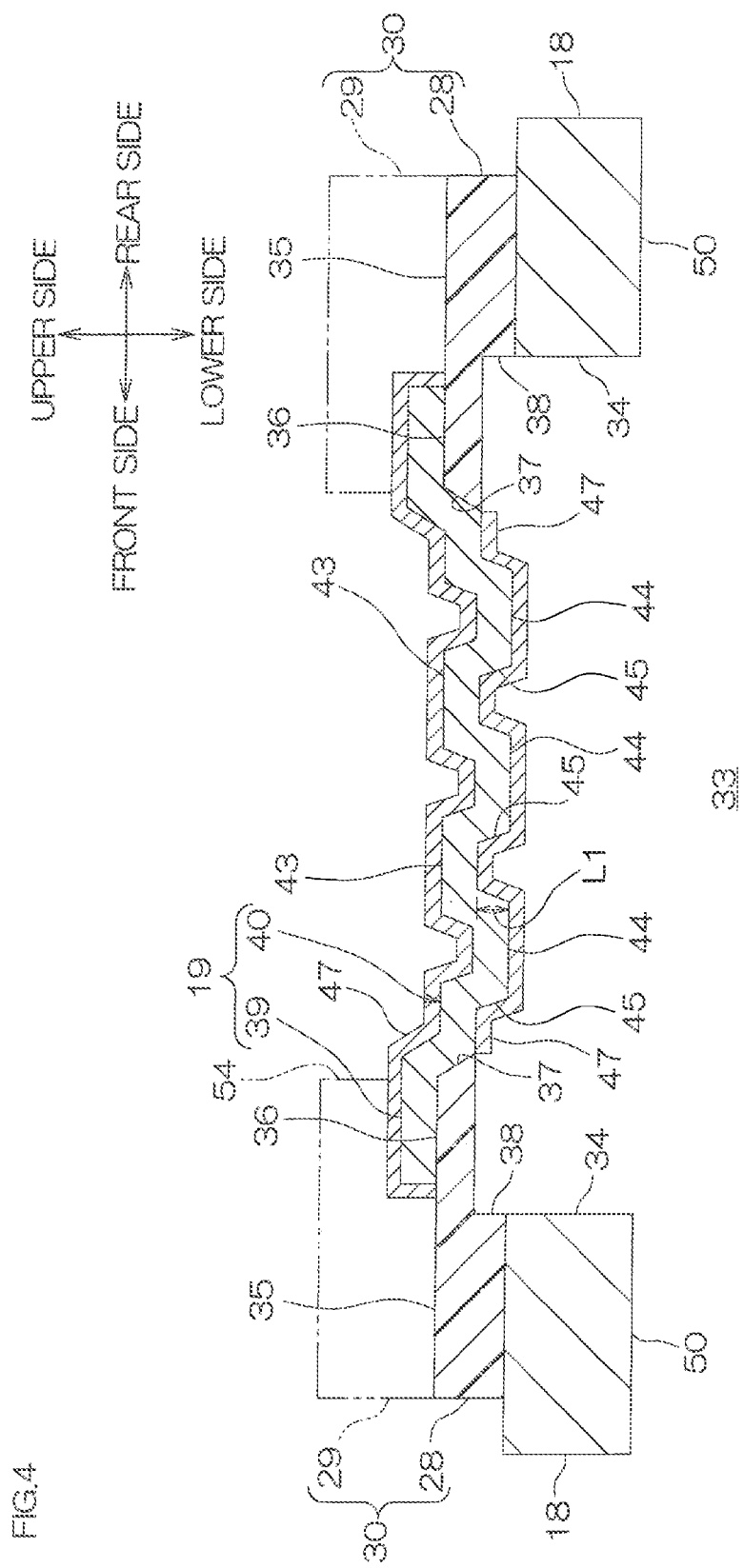
FIG. 4 shows an enlarged cross-sectional view of a piezoelectric-side terminal of the assembly shown in FIG. 3.
Figure 5:
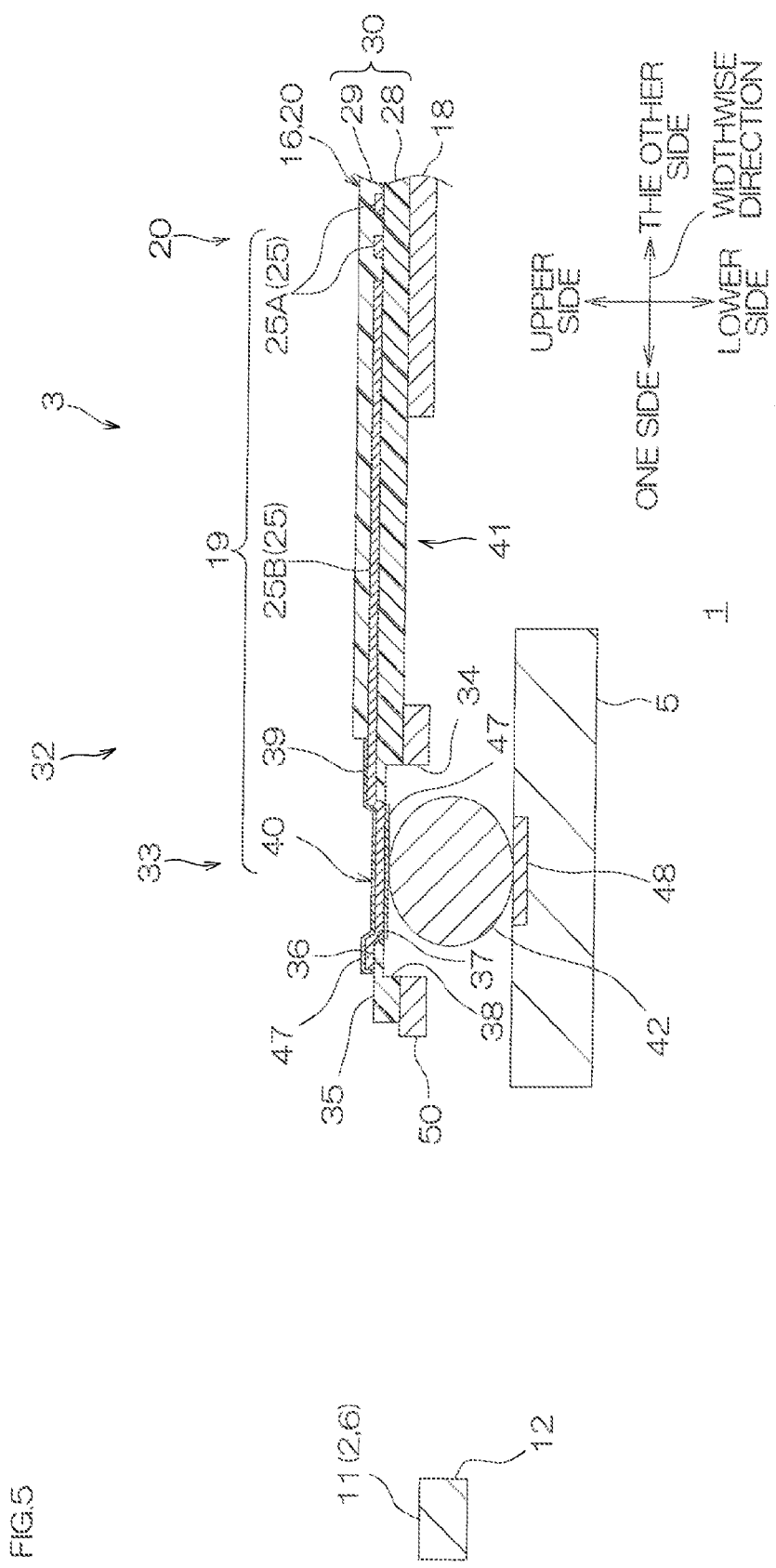
FIG. 5 shows a cross-sectional view of the assembly shown in FIG. 1, which is taken along the line C-C.
Figure 6:
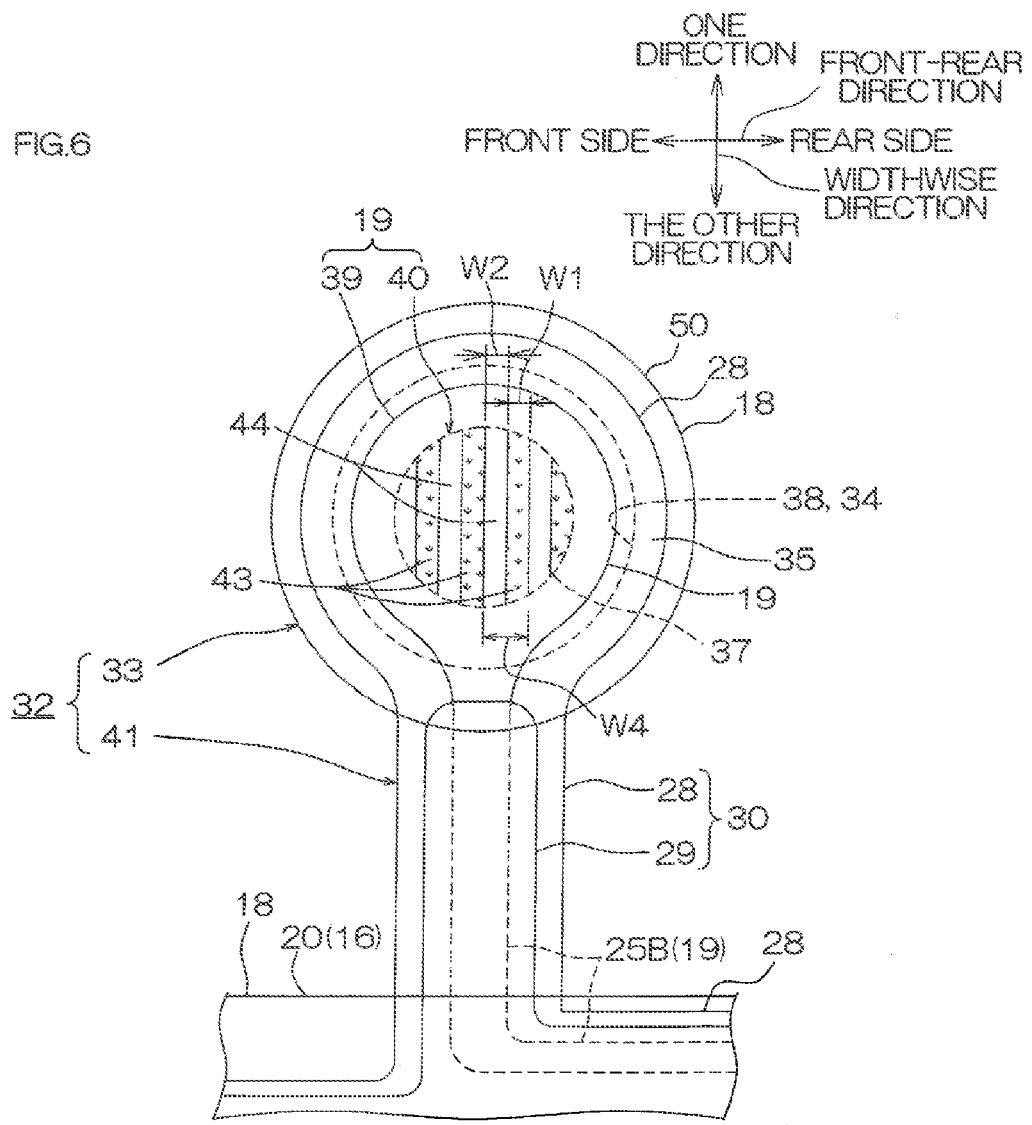
FIG. 6 shows an enlarged plan view of a connecting arm of the assembly shown in FIG. 1.
Figure 7:
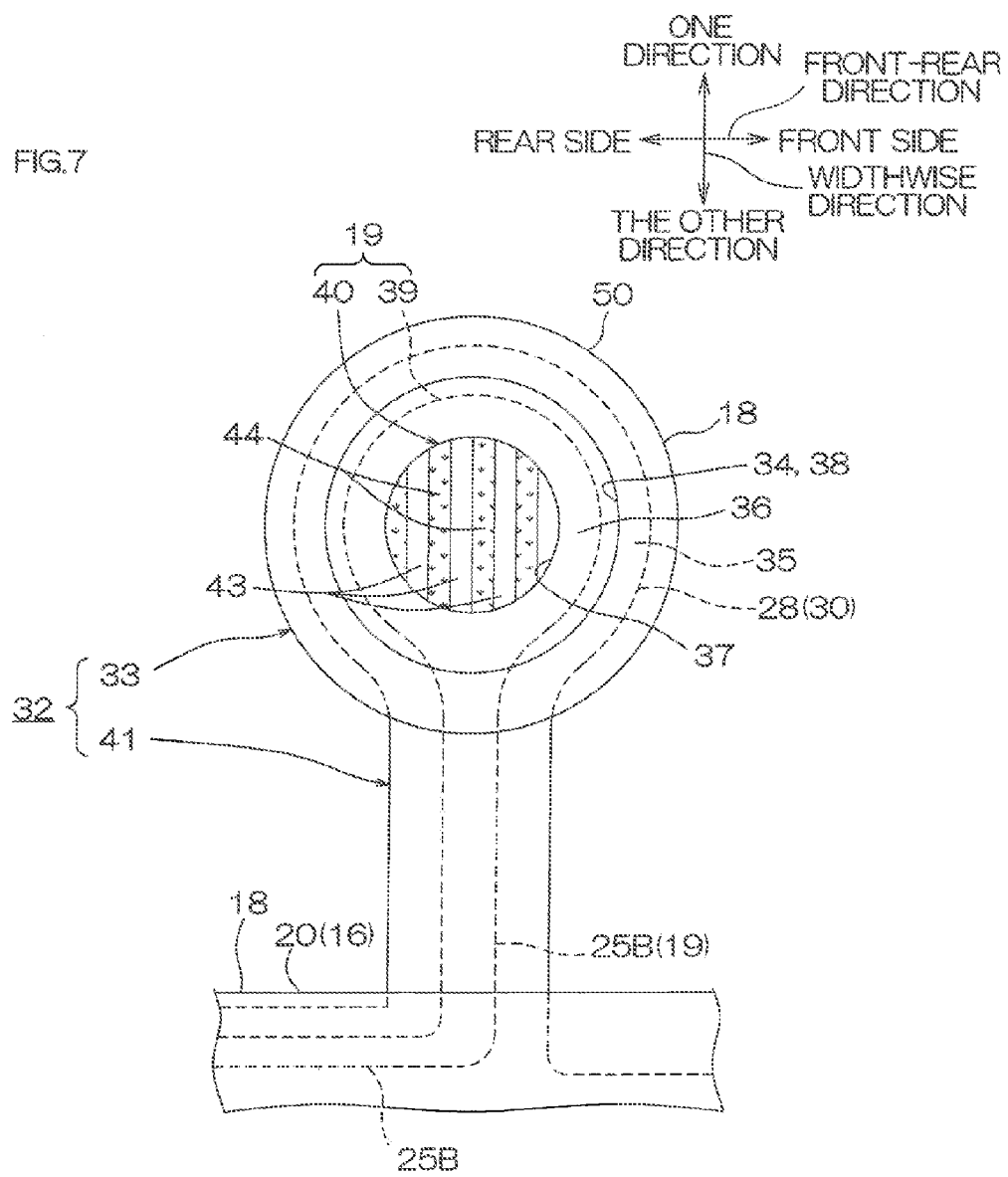
FIG. 7 shows an enlarged bottom view of a connecting arm of the assembly shown in FIG. 1.
Figure 8:
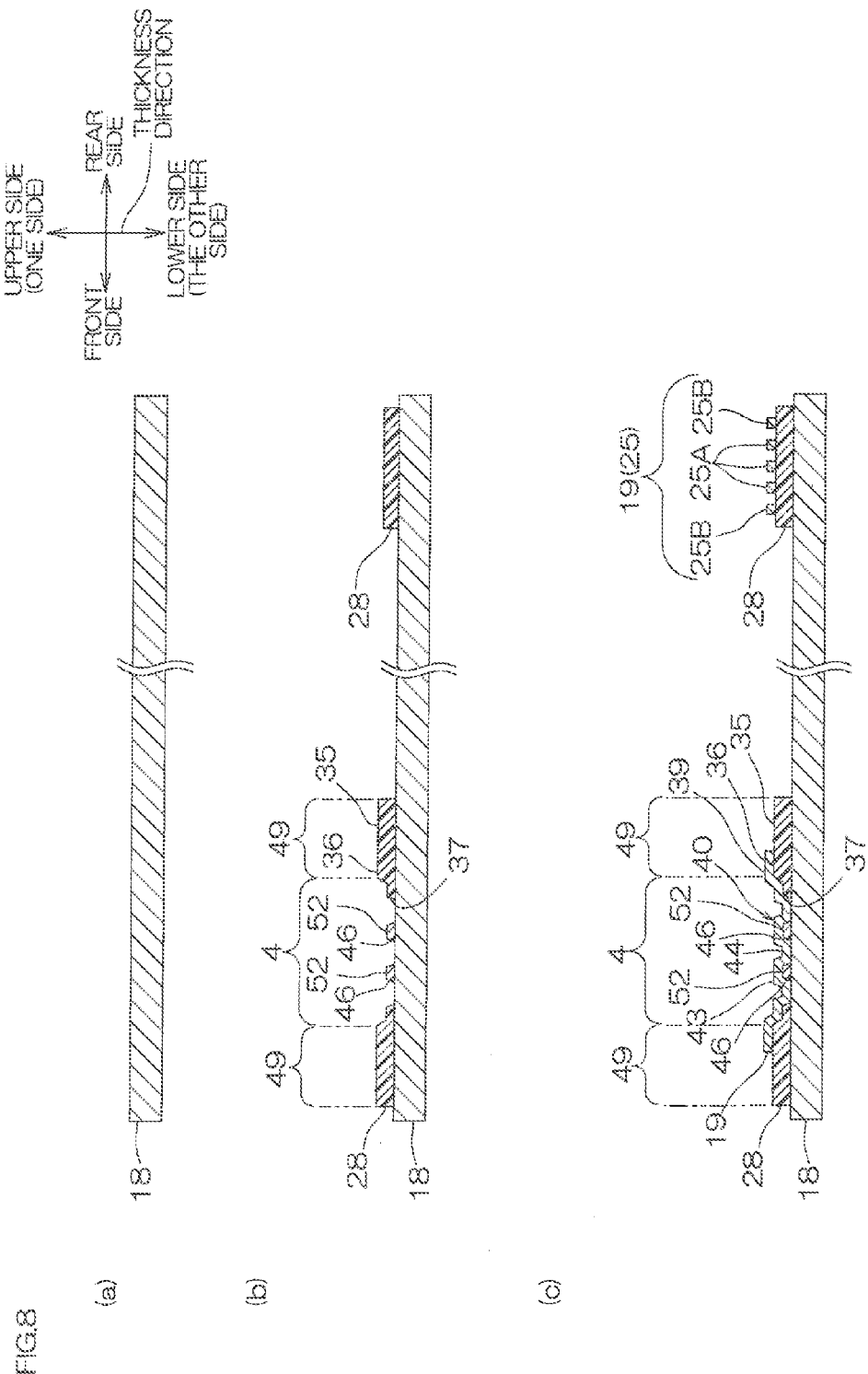
FIG. 8 is a process view illustrating a producing method of the suspension board with circuit,
(a) showing the step of preparing a metal supporting board,
(b) showing the step of forming an insulating base layer, and
(c) showing the step of forming a conductive layer.
Figure 9:
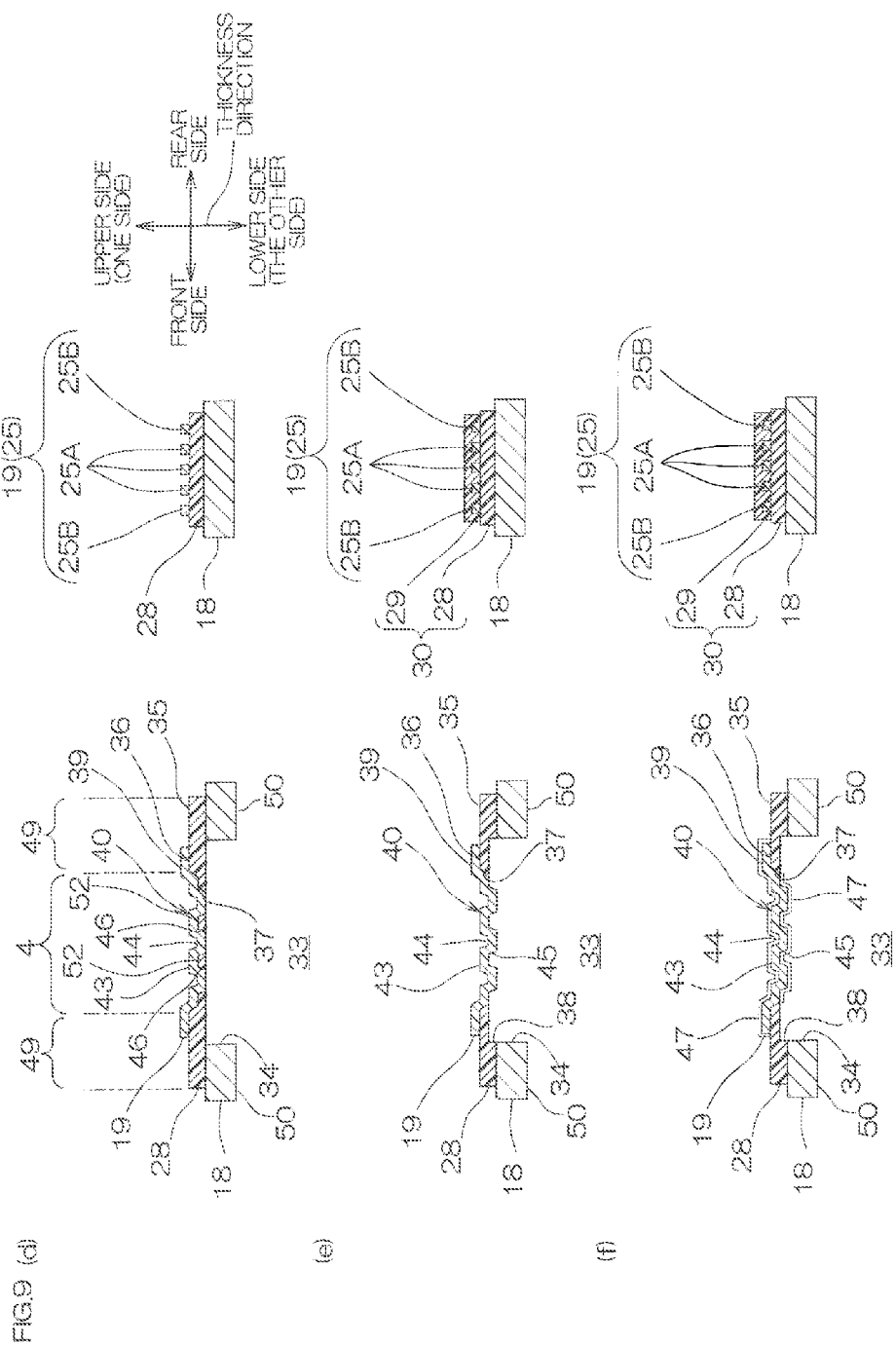
FIG. 9 is a process view illustrating the producing method of the suspension board with circuit, subsequently to FIG. 8,
(d) showing the step of forming a support opening,
(e) showing the step of forming a first base opening and a second base opening, and
(f) showing the step of forming a protective thin film.

FIG. 1 shows a plan view of an assembly including a suspension board with circuit as an embodiment of a wired circuit board of the present invention. FIG. 2 shows a cross-sectional view of the assembly shown in FIG. 1, which is taken along the line A-A. FIG. 3 shows a cross-sectional view of the assembly shown in FIG. 1, which is taken along the line B-B. FIG. 4 shows an enlarged cross-sectional view of a piezoelectric-side terminal of the assembly shown in FIG. 3. FIG. 5 shows a cross-sectional view of the assembly shown in FIG. 1, which is taken along the line C-C. FIG. 6 shows an enlarged plan view of a connecting arm of the assembly shown in FIG. 1. FIG. 7 shows an enlarged bottom view of a connecting arm of the assembly shown in FIG. 1. FIGS. 8 and 9 are process views illustrating a producing method of the suspension board with circuit.

Note that, in FIG. 1, an insulating base layer 28 and an insulating cover layer 29 are omitted for clear illustration of relative positioning of a metal supporting board 18 and a conductive layer 19.

In FIGS. 1 and 2, an assembly 1 is a head-stack assembly (HSA) to be mounted in a hard disk drive (not shown). In the assembly 1, a suspension board with circuit 3 on which a slider 22 mounting thereon a magnetic head (not shown) is mounted is supported on a support plate 2. The assembly 1 includes the support plate 2, the suspension board with circuit 3 disposed on (the other side in a thickness direction, which holds true thereinafter) the support plate 2 and supported on the support plate 2, and piezoelectric elements (piezo elements) 5 as electronic elements for accurately and finely adjusting the position and angle of the suspension board with circuit 3, while being supported on the support plate 2.

The support plate 2 is formed so as to extend in a longitudinal direction (front-rear direction), and includes an actuator plate portion 6, a base plate portion 7 formed under the actuator plate portion 6 (on one side in the thickness direction, which holds true hereinafter), and a load beam portion 8 formed to be continued to the front side of the actuator plate portion 6.

The actuator plate portion 6 integrally includes a rear plate portion 9, a front plate portion 10 disposed on the front side of the rear plate portion 9 to be spaced apart therefrom, and flexible portions 11 formed between the rear plate portion 9 and the front plate portion 10.

The rear plate portion 9 is formed in a generally rectangular plan view shape in the rear end portion of the actuator plate portion 6.

The front plate portion 10 is formed in a generally rectangular plan view shape extending in a widthwise direction (direction perpendicular to the front-rear direction).

The flexible portions 11 are provided on both widthwise sides of the actuator plate portion 6. The flexible portion 11 on one widthwise side is formed to extend between the front end portion of the rear plate portion 9 and the rear end portion of the front plate portion 10. Also, the flexible portion 11 on the other widthwise side is formed to extend between the front end portion of the rear plate portion 9 and the rear end portion of the front plate portion 10.

The both flexible portions 11 have respective middle portions thereof in the front-rear direction which are formed to be curved outwardly on both widthwise sides and have generally equal widths in the front-rear direction. Specifically, the middle portions of the flexible portions 11 in the front-rear direction are formed so as to outwardly protrude into generally U-shaped (or generally V-shaped) shapes on both widthwise sides.

Accordingly, the flexible portions 11 are formed to be able to bring the front plate portion 10 away from and closer to the rear plate portion 9 due to the extension/contraction of the piezoelectric elements 5, as described later.

The actuator plate portion 6 is also formed with plate openings 12 defined by the front surface of the rear plate portion 9, the rear surface of the front plate portion 10, and the widthwise inner surfaces of the flexible portions 11. The plate openings 12 extend through the actuator plate portion 6 in the thickness direction.

In the front end portion of the rear plate portion 9 and the rear end portion of the front plate portion 10, two pairs of attachment regions 13 to which the rear end portions and front end portions of the piezoelectric elements 5 are respectively attached are defined. The attachment regions 13 are each formed in a widthwise elongated generally rectangular bottom view shape in one widthwise end portion or in the other widthwise end portion to correspond to the front end portion of the rear plate portion 9 and the rear end portion of the front plate portion 10.

The base plate portion 7 is fixed to the middle portion of the lower surface of the rear plate portion 9 in each of the widthwise direction and the front-rear direction. The base plate portion 7 has a front portion thereof formed in a generally rectangular shape and a rear portion thereof formed in a generally semi-circular shape when viewed in plan view.

The support plate 2 is formed with a hole 14 having a generally circular bottom view shape and extending through the middle portion of the rear plate portion 9 and the middle portion of the base plate portion 7.

Note that, to the base plate portion 7, a drive coil (not shown) for causing the front end portion of the assembly 1 to swing around the hole 14 is attached.

The load beam portion 8 is integrally formed with the actuator plate portion 6. Specifically, the load beam portion 8 is formed to extend from the front end of the front plate portion 10 toward the front side, and formed in a generally trapezoidal shape which gradually decreases in width with approach to the frontmost portion.

The support plate 2 is formed of a metal material such as, e.g., stainless steel, aluminum, iron, or an alloy thereof.

The size of the support plate 2 is set appropriately. For example, the thickness of each of the actuator plate portion 6 and the load beam portion 8 is in a range of, e.g., 30 to 150 µm, and the thickness of the base plate portion 7 is in a range of, e.g., 150 to 200 µm.

Note that the support plate 2 is provided as an integrated actuator-plate/load-beam plate integrally including the actuator plate portion 6 and the load-beam portion 8.

The suspension board with circuit 3 is formed in a generally flat-belt plan view shape extending in the front-rear direction.

As shown in FIG. 1, the suspension board with circuit 3 is provided with the metal supporting board 18 and the conductive layer 19 supported on the metal supporting board 18.

The metal supporting board 18 is formed so as to correspond to the outer shape of the suspension board with circuit 3, and integrally includes a wiring portion 16, a front portion 15 formed on the front side of the wiring portion 16, and a rear portion 17 formed on the rear side of the wiring portion 16.

The wiring portion 16 is formed in the middle portion of the metal supporting board 18 in the front-rear direction, and integrally includes a first linear portion 20 extending in the front-rear direction, and a first bent portion 21 bent on one side in the widthwise direction from the rear end portion of the first linear portion 20, and then further bent rearward. Note that the first linear portion 20 and the first bent portion 21 are formed to have generally equal widths in the front-rear direction.

The wiring portion 16 supports wires 25 (described later).

The front portion 15 is formed in a generally rectangular plan view shape continued from the front end of the first linear portion 20, and slightly protruding outward on both widthwise sides from the wiring portion 16. Specifically, the front portion 15 includes a gimbal 23 on which the slider 22 (described later) is mounted, and a gimbal rear portion 24 connecting the gimbal 23 and the first linear portion 20.

The gimbal 23 is formed in a generally rectangular plan view shape having a width larger than the width of the first linear portion 20. The gimbal 23 supports front-side terminals 26 (described later), while mounting thereon the slider 22 (described later) having the magnetic head (not shown) electrically connected to the front-side terminals 26.

The gimbal rear portion 24 is formed in a generally triangular shape continued to the rear end of the gimbal 23 and gradually decreasing in width with approach to the rearmost portion. The gimbal rear portion 24 supports the wires 25.

The rear portion 17 is formed in a generally rectangular plan view shape continued from the rear end of the first curved portion 21 and having generally the same width as that of the first curved portion 21. The rear portion 17 supports rear-side terminals 27 (described later).

The conductive layer 19 integrally includes the wires 25 extending along the front-rear direction, the front-side terminals 26 continued to the front end portions of the wires 25, and the rear-side terminals 27 continued to the rear end portions of the wires 25 above the metal supporting board 18.

The wires 25 include signal wires 25A each for transmitting an electric signal between the magnetic head (not shown) and a read/write board (not shown), and disposed throughout the front-rear direction of the suspension board with circuit 3. The plurality of (four) signal wires 25A are arranged in widthwise spaced-apart relation.

The wires 25 also include a plurality of (two) power-source wires 25B.

The power-source wires 25B are electrically connected to power-source-side terminals 27B described next. The power-source wires 25B are disposed to be continued to the power-source-side terminals 27B in the rear portion 17, arranged in parallel and spaced-apart relation on both sides of the signal wires 25A in the rear portion 17 and the first bent portion 21, and curved outwardly on both widthwise sides in the middle portion of the first linear portion 20 in the front-rear direction to reach frame conductors 39 (see FIG. 6) described later.

The front-side terminals 26 are disposed on the front portion 15. Specifically, the plurality of (four) front-side terminals 26 are arranged along the front end surface of the slider 22 in widthwise spaced-apart relation on the front side of the gimbal 23.

The front-side terminals 26 are head-side terminals 26A electrically connected to the magnetic head (not shown).

The rear-side terminals 27 are disposed on the rear end portion of the rear portion 17. Specifically, the plurality of (six) rear-side terminals 27 are disposed to be spaced apart from each other in the front-rear direction. The rear-side terminals 27 are continued to the signal wires 25A, and include a plurality of (four) external terminals 27A connected to the terminals of the read/write board.

The rear-side terminals 27 also include the plurality of (two) power-source-side terminals 27B continued to the power-source wires 25B and electrically connected to the piezoelectric elements 5. Note that the power-source-side terminals 27B are disposed in spaced-apart relation on both sides of the external terminals 27A in the front-rear direction, and electrically connected to a power source (not shown).

As shown in FIGS. 3 and 5, the suspension board with circuit 3 includes the metal supporting board 18, an insulating layer 30 formed thereon, and the conductive layer 19 covered with the insulating layer 30.

The metal supporting board 18 is formed of a metal material such as, e.g., stainless steel, a 42-alloy, aluminum, a copper-beryllium alloy, or phosphor bronze. Preferably, the metal supporting board 18 is formed of stainless steel. The thickness of the metal supporting board 18 is in a range of, e.g., 15 to 50 µm, or preferably 15 to 20 µm.

The insulating layer 30 includes the insulating base layer 28 formed on the upper surface of the metal supporting board 18, and the insulating cover layer 29 formed on the insulating base layer 28 so as to cover the wires 25.

As shown in FIG. 1, the insulating base layer 28 is formed in a pattern corresponding to the conductive layer 19 on the upper surface of the metal supporting board 18 in the front portion 15, the wiring portion 16, and the rear portion 17.

The insulating base layer 28 is formed of an insulating material such as a synthetic resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. Preferably, the insulating base layer 28 is formed of a polyimide resin.

The thickness (maximum thickness) of the insulating base layer 28 is in a range of, e.g., 1 to 35 µm, or preferably 8 to 15 µm.

The insulating cover layer 29 is formed over the wiring portion 16, the front portion 15, and the rear portion 17 so as to cover the upper surface of the insulating base layer 28 exposed from the wires 25 and the upper surface and side surfaces of the wires 25. The insulating cover layer 29 is also formed in a pattern exposing the front-side terminals 26 in the front portion 15 and exposing the rear-side terminals 27 in the rear portion 17.

The insulating cover layer 29 is formed of the same insulating material as the insulating material of the insulating base layer 28. The thickness of the insulating cover layer 29 is in a range of, e.g., 1 to 40 μm, or preferably 1 to 10 μm.

As shown in FIGS. 1 and 3, the conductive layer 19 is formed in the foregoing pattern over the upper surface of the insulating base layer 28 in the front portion 15, the wiring portion 16, and the rear portion 17.

The conductive layer 19 is formed of a conductive material such as, e.g., copper, nickel, gold, a solder, or an alloy thereof. Preferably, the conductive layer 19 is formed of copper.

The thickness of the conductive layer 19 is in a range of, e.g., 3 to 50 μm, or preferably 5 to 20 μm.

The width of each of the wires 25 is in a range of, e.g., 5 to 200 μm, or preferably 8 to 100 μm. The spacing between the individual wires 25 is in a range of, e.g., 5 to 1000 μm, or preferably 8 to 100 μm.

The widths and lengths of the front-side terminals 26 and the rear-side terminals 27 are in a range of, e.g., 20 to 1000 μm, or preferably 30 to 800 μm. The spacing between the individual front-side terminals 26 and the spacing between the individual rear-side terminals 27 are in a range of, e.g., 20 to 1000 μm, or preferably 30 to 800 μm.

In the suspension board with circuit 3, as shown in FIGS. 1 and 2, the lower surface of the metal supporting board 18 is supported on the support plate 2. Specifically, the lower surfaces of the wiring portion 16 and the front portion 15 are supported on the support plate 2, while the lower surface of the rear portion 17 protrudes rearward from the support plate 2 without being supported on the support plate 2.

Specifically, in the suspension board with circuit 3, the first bent portion 21 is disposed in a generally L-shaped shape along the one widthwise end portion of the rear plate portion 9 and the front end portion thereof, and the first linear portion 20 is disposed to extend from the widthwise middle portion of the front end portion of the rear plate portion 9, traverse the widthwise middle portion between the plate openings 12, and then reach the widthwise middle portion of the front plate portion 10. Also, in the suspension board with circuit 3, the front portion 15 is disposed to be formed on the widthwise middle portion of the load beam portion 8 to extend throughout the front-rear direction of the load beam portion 8.

The piezoelectric elements 5 are attached to the lower side of the support plate 2.

Specifically, the plurality of (two) piezoelectric elements 5 are provided in widthwise spaced-apart relation.

Each of the piezoelectric elements 5 is an actuator extendable/contractable in the front-rear direction, and is formed in a generally rectangular plan view shape elongated in the front-rear direction. The piezoelectric element 5 is disposed so as to span the plate opening 12 in the front-rear direction.

Specifically, the both end portions of each of the piezoelectric elements 5 in the front-rear direction are bonded to the attachment regions 13 (broken lines of FIG. 1) in the front end portion of the rear plate portion 9 and in the rear end portion of the front plate portion 10 via adhesive layers 31, and fixed thereto.

As shown in FIG. 3, in the middle portion of the upper surface of each of the piezoelectric elements 5 in the front-rear direction, a piezoelectric terminal 48 is provided, and electrically connected to the piezoelectric-side terminal 40 (described later) of the suspension board with circuit 3.

The piezoelectric elements 5 are supplied with electricity from the piezoelectric-side terminals 40 and the piezoelectric terminal 48 to have voltages thereof controlled and consequently extend/contract.

Next, a detailed description is given to the piezoelectric-side terminal 40 on one widthwise side in the suspension board with circuit 3. Note that the piezoelectric-side terminal 40 on the other widthwise side is formed to be symmetrical with the piezoelectric-side terminal 40 on one widthwise side with respect to the first linear portion 20, and a description thereof is omitted.

In the suspension board with circuit 3, as shown in FIGS. 6 and 7, a connecting arm 32 including the piezoelectric-side terminal 40 is provided.

The connecting arm 32 is provided so as to protrude widthwise outward in an arm-like shape from the middle portion of the first linear portion 20 in the front-rear direction.

The connecting arm 32 includes a pad portion 33 disposed on one widthwise side of the first linear portion 20 to be spaced apart therefrom, and a joint portion 41 coupling the pad portion 33 to the first linear portion 20.

As shown in FIGS. 3 and 4, the pad portion 33 includes the metal supporting board 18, the insulating base layer 28 formed on the metal supporting board 18, and the conductive layer 19 formed on the insulating base layer 28.

In the pad portion 33, the metal supporting board 18 is formed in a generally annular (ring) plan view shape as a supporting pad 50, as shown in FIGS. 6 and 7. That is, as shown in FIG. 3, the middle portion of the supporting pad 50 is formed with a support opening 34 having a generally circular plan view shape and extending therethrough in the thickness direction.

In the pad portion 33, as shown in FIGS. 4 and 6, the insulating base layer 28 is formed in a generally annular (ring) plan view shape slightly smaller than the supporting pad 50. The middle portion of the insulating base layer 28 is formed with a first base opening 37 which is a base opening serving as an insulating opening having a generally circular plan view shape and extending therethrough in the thickness direction. That is, the insulating base layer 28 is formed such that the inner diameter of the first base opening 37 thereof is smaller than the inner diameter of the support opening 34 of the supporting pad 50, and the outer diameter of the insulating base layer 28 is smaller than the outer diameter of the supporting pad 50.

That is, as shown in FIG. 4, an inner peripheral portion 36 of the insulating base layer 28 is formed so as to protrude inward (into the support opening 34) from the inner peripheral surface of the supporting pad 50 when viewed in plan view, while an outer peripheral portion 35 of the insulating base layer 28 is formed so as to overlap the supporting pad 50 when projected in the thickness direction. That is, the outer peripheral portion 35 of the insulating base layer 28 is stacked on the upper surface of the supporting pad 50.

The inner peripheral portion 36 of the insulating base layer 28 in the pad portion 33 is formed thinner than the outer peripheral portion 35.

Inside the outer peripheral portion 35 and under the inner peripheral portion 36, a second base opening 38 as an insulating opening is formed. The second base opening 38 is disposed concentric to the first base opening 37, and formed to have an inner diameter which is thereof larger than the inner diameter of the first base opening 37 and the same as the diameter of the support opening 34 in the supporting pad 50.

As shown in FIGS. 3 and 6, the conductive layer 19 includes the frame conductor 39 formed on the upper surface of the inner peripheral portion 36 of the insulating base layer 28, and the piezoelectric-side terminal 40 as a terminal continued to the inside of the frame conductor 39.

As shown in FIG. 6, the frame conductor 39 is formed in a generally annular (ring) shape slightly smaller than the insulating base layer 28. Specifically, the outer diameter of the frame conductor 39 is formed smaller than the outer diameter of the insulating base layer 28 when projected in the thickness direction, as shown in FIG. 3.

As shown in FIG. 6, the piezoelectric-side terminal 40 is formed in a generally circular plan view shape continued to the inner peripheral portion of the frame conductor 39 when viewed in plan view.

As shown in FIGS. 3 and 5, the piezoelectric-side terminal 40 is also formed so as be recessed from the inner peripheral portion of the frame conductor 39 into the first base opening 37 of the insulating base layer 28.

The lower surface of the piezoelectric-side terminal 40 is exposed in the first base opening 37 and the second base opening 38 of the insulating base layer 28 and in the support opening 34 of the supporting pad 50. The upper surface of the piezoelectric-side terminal 40 is also exposed.

As shown in FIGS. 3 and 4, the piezoelectric-side terminal 40 is formed in a pattern which is indented in the thickness direction.

Specifically, the piezoelectric-side terminal 40 is formed in a generally meandering shape in a cross section along the front-rear direction (specifically, in cross sections along the front-rear direction and the thickness direction). Note that, in the piezoelectric-side terminal 40, a through hole extending therethrough in the thickness direction is not formed.

More specifically, as shown in FIGS. 4 and 6, the piezoelectric-side terminal 40 integrally includes a plurality of (for example, an even number, in particular, four) upper walls 43 disposed to be spaced apart from each other in the front-rear direction, lower walls 44 disposed between the individual upper walls 43 when projected in the thickness direction, and connecting walls 45 connecting the upper walls 43 and the lower walls 44.

The upper walls 43 are formed in a striped (stripe) pattern when viewed in plan view. Specifically, the upper walls 43 are formed so as to extend in parallel along the widthwise direction. The respective lower surfaces of the upper walls 43 are formed at the same level as that of the lower surface of the inner peripheral portion 36 of the insulating base layer 28 when projected in the planar direction (the front-rear direction and the widthwise direction), as shown in FIG. 4.

As shown in FIGS. 4 and 7, the lower walls 44 are formed in a striped (stripe) pattern in which the plurality of (for example, the same number as the upper walls 43, in particular, four) lower walls 44 are disposed in lines to be spaced apart from each other in the front-rear direction. Specifically, the plurality of lower walls 44 are formed so as to extend in parallel along the widthwise direction.

As also shown in FIG. 4, the lower walls 44 are disposed below the upper walls 43 when projected in the planar direction. Specifically, the lower surfaces of the lower walls 44 are formed at the same level as that of the lower surface of the outer peripheral portion 35 of the insulating base layer 28.

The connecting walls 45 connect the respective end portions of the upper walls 43 and the lower walls 44 in the front-rear direction which are adjacent to each other. The connecting walls 45 are formed along the inner peripheral surfaces (outer side surfaces of pattern insulating portions 52) of pattern openings 46 in a producing method (see FIG. 8(b)) of the suspension board with circuit 3 described later.

The dimensions of the pad portion 33 are selected appropriately. As shown in FIG. 7, the outer diameter (maximum length) of the supporting pad 50 is in a range of, e.g., 100 to 1000 μm, and the inner diameter of the supporting pad 50 (outer diameter (maximum length) of the support opening 34) is in a range of, e.g., 50 to 990 μm.

As shown in FIG. 6, the outer diameter (maximum length) of the insulating base layer 28 (the outer peripheral portion 35 thereof) is in a range of, e.g., 100 to 1000 μm. As shown in FIG. 7, the inner diameter (outer diameter (maximum length) of the first base opening 37) of the inner peripheral portion 36 of the insulating base layer 28 is in a range of, e.g., 20 to 980 μm, and the inner diameter (outer diameter (maximum length) of the second base opening 38) of the outer peripheral portion 35 of the insulating base layer 28 is the same as the inner diameter (outer diameter (maximum length) of the support opening 34) of the supporting pad 50.

As also shown in FIG. 6, the outer diameter (maximum length) of the frame conductor 39 of the conductive layer 19 is in a range of, e.g., 90 to 990 μm. As shown in FIG. 7, the outer diameter (maximum length) of the piezoelectric-side terminal 40 is the same as the outer diameter (maximum length) of the first base opening 37.

The dimensions of the piezoelectric-side terminal 40 are selected appropriately. As shown in FIG. 4, when the piezoelectric-side terminal 40 is projected in the planar direction, a spacing L1 between the lower surfaces of the upper walls 43 and the lower surfaces of the lower walls 44 is in a range of e.g., 1.5 to 4 μm, or preferably 2 to 3.5 μm.

When the spacing L1, i.e., the depth (height) L1 of the indentations of the piezoelectric-side terminal 40 is under the range shown above, it may be impossible to sufficiently increase the adhesion area between the piezoelectric-side terminal 40 and a conductive adhesive 42 (see FIG. 3) and sufficiently improve the adhesion therebetween.

On the other hand, when the distance L1 is over the range shown above, it may be possible that the insulating base layer 28 present on the lower surfaces of the upper walls 43 cannot be reliably removed in the step (see FIG. 9(e)) of removing the insulating base layer 28 in the producing method of the suspension board with circuit 3 described later, and remains to cause a connection failure between the piezoelectric-side terminal 40 and the conductive adhesive 42 (see FIG. 3).

The ratio (S1/S2) of the total bottom area S1 of the individual upper walls 43 to the bottom area S2 of the individual lower walls 44 is in a range of, e.g., 2/8 to 8/2, or preferably 3/7 to 7/3. The ratio (=S2/S3) of the total area S1 of the bottom area of the upper wall 43 relative to the bottom area S3 of the piezoelectric-side terminal 40, that is, total sum (=S1+S2) of the total area S1 of the bottom area of the upper walls 43 and the bottom area S2 of the lower walls 44 is, for example, 1/20 to 2/3, or preferably 1/10 to 1/2.

Also, as shown in FIG. 6, the width W1 (length in the front-rear direction) of each of the upper walls 43 is in a range of, e.g., 5 to 100 μm, or preferably 10 to 50 μm. The width W2 (length in the front-rear direction) of each of the lower walls 44 is a range of, e.g., 5 to 100 μm, or preferably 10 to 50 μm. Also, as shown in FIG. 6, a pitch W4 of the indentations, i.e., a total width W4 (=W1+W2) of the width W1 of the upper wall 43, and the width W2 of the lower wall 44 is in a range of, e.g., 10 to 200 μm, preferably 20 to 100 μm, or more preferably 20 to 60 μm.

On the other hand, a ratio (=S3/(S3+S4)) of a plane area (substantially the same as the bottom area) S3 of the piezoelectric-side terminal 40 to the total area of a plane area S3 of the piezoelectric-side terminal 40 and a plane area S4 of the frame conductor 39 is, e.g., over 5%, or preferably over 10%, and normally, e.g., less than 100%.

As shown in FIGS. 6 and 7, the joint portion 41 connects one widthwise end portion of the middle portion of the first linear portion 20 in the front-rear direction and the other widthwise end portion of the pad portion 33.

The joint portion 41 is formed in a generally rectangular plan view shape extending in the widthwise direction, and having a width (length in the front-rear direction shorter) smaller than the outer diameter of the pad portion 33.

As shown in FIGS. 5 and 6, the joint portion 41 includes the insulating base layer 28, the power-source wire 25B formed on the insulating base layer 28, and the insulating cover layer 29 formed so as to cover the power-source wire 25B.

In the joint portion 41, as shown in FIG. 6 the insulating base layer 28 is formed in a shape corresponding to the outer shape of the joint portion 41. The insulating base layer 28 in the joint portion 41 is formed to be continued to the insulating base layer 28 in the first linear portion 20 and to the insulating base layer 28 in the pad portion 33.

The power-source wire 25B in the joint portion 41 is formed so as to extend along the widthwise direction, and formed to be continued to the power-source wire 25B of the first linear portion 20 and to the other widthwise end portion of the frame conductor 39 of the pad portion 33.

In the joint portion 41, the insulating cover layer 29 is formed in a pattern covering the upper surface and side surface of the power-source wire 25B and exposing the upper surfaces of the both end portions of the insulating base layer 28 in the front-rear direction.

Note that, in the suspension board with circuit 3, as shown in FIGS. 3 and 5, protective thin films 47 are formed on the respective surfaces of the individual terminals, which are specifically the front-side terminals 26 (see FIG. 1), the rear-side terminals 27 (see FIG. 1), and the piezoelectric-side terminal 40 and the frame conductor 39.

In the pad portion 33, the protective thin films 47 are formed on the upper surface and outer side surface of the frame conductor 39, while being formed on the both upper and lower surfaces of the piezoelectric-side terminal 40.

The protective thin films 47 are formed of a metal material such as, e.g., nickel or gold. Preferably, the protective thin films 47 are formed of nickel. The thickness of each of the protective thin films 47 is in a range of, e.g., 0.05 to 0.1 µm.

Next, a producing method of the assembly 1 is described.

To produce the assembly 1, each of the suspension board with circuit 3, the support plate 2, and the piezoelectric elements 5 is prepared first.

Next, a method of preparing (producing) the suspension board with circuit 3 is described with reference to FIGS. 8 and 9.

In the method, as shown in FIG. 8(a), the metal supporting board 18 is prepared first.

Next, as shown in FIG. 8(b), the insulating base layer 28 is formed on the metal supporting board 18 (one side in the thickness direction in the production process views of FIGS. 8 and 9, which holds true hereinafter).

Specifically, the insulating base layer 28 is formed on the metal supporting board 18 into a pattern formed with piezoelectric-side-terminal formation regions 4 as terminal formation regions corresponding to the piezoelectric-side terminals 40 to be subsequently formed, and frame formation regions 49 corresponding to the frame conductors 39.

The piezoelectric-side-terminal formation regions 4 include the pattern openings 46 for exposing the upper surface of the metal supporting board 18 in a pattern shape, and the pattern insulating portions 52 defined by the pattern openings 46.

The pattern openings 46 are filled with the lower walls 44 in the next step (FIG. 8(c)) of forming the conductive layer 19, and therefore formed in substantially the same pattern as that of the lower walls 44 mentioned above. On the upper surfaces of the pattern insulating portions 52, the upper walls 43 are stacked in the next step (FIG. 8(c)) of forming the conductive layer 19, and therefore the pattern insulating portions 52 are formed in substantially the same pattern as that of the upper walls 43 mentioned above.

The thickness of each of the frame formation regions 49 is the same as the thickness of the insulating base layer 28 (see FIG. 6) in the joint portions 41. On the other hand, the pattern insulating portions 52 are formed thinner than the frame formation regions 49. The thickness of each of the pattern insulating portions 52 is, e.g., 15 to 50% of the thickness of the insulating base layer 28 in the frame formation regions 49, and specifically in a range of 1.5 to 5 µm.

Specifically, to form the insulating base layer 28, for example, a varnish of a photosensitive insulating material is coated first on the upper surface of the metal supporting board 18 and dried to form a photosensitive base coating.

Next, the photosensitive base coating is subjected to light exposure (gradation exposure) via a gradation exposure photomask not shown. The gradation exposure photomask includes a light shielding portion, a light semi-transmitting portion, and a light full transmitting portion in a pattern. The light full transmitting portion is disposed to face the portions (except for portions where the pattern insulating portions 52 are to be formed) of the base coating where the insulating base layer 28 in the frame formation regions 49 is to be formed. The light semi-transmitting portion is disposed to face the portions of the base coating where the pattern insulating portions 52 are to be formed. The light shielding portion is disposed to face the portions (i.e., the portions where the insulating base layer 28 is not formed) of the base coating where the pattern openings 46 are to be formed.

Thereafter, the base coating subjected to the gradation exposure is developed, and cured by heating as necessary to form the insulating base layer 28 into a pattern formed with the piezoelectric-side-terminal formation regions 4 and the frame formation regions 49 (the pattern openings 46 and the pattern insulating portions 52).

Next, as shown in FIG. 8(c), the conductive layer 19 is formed on the insulating base layer 28 and the upper surface of the metal supporting board 18 exposed from the pattern openings 46 by an additive method, a subtractive method, or the like. Preferably, the conductive layer 19 is formed by an additive method.

That is, as shown in FIG. 1, the conductive layer 19 is formed to include the wires 25 formed on the insulating base layer 28, and the front-side terminals 26, the rear-side terminals 27, and the piezoelectric-side terminals 40 each continued thereto.

Specifically, as shown in FIG. 8(c), each of the piezoelectric-side terminals 40 is formed in the piezoelectric-side-terminal formation region 4 of the insulating base layer 28. Specifically, since the piezoelectric-side terminal 40 is formed to follow the upper surfaces of the pattern insulating portions 52 and the upper surface of the metal supporting board 18 exposed from the pattern openings 46 and have an equal thickness throughout planar directions, the piezoelectric-side terminal 40 is formed in the pattern indented in the thickness direction described above.

In this manner, the conductive layer 19 having the shape described above is formed.

Next, as shown in FIGS. 5 and 6, the insulating cover layer 29 is formed in the pattern described above.

Specifically, a varnish of a photosensitive insulating material is coated on the entire upper surface of the metal supporting board 18 including the conductive layer 19 and the insulating base layer 28, dried, exposed to light, developed, and then cured by heating.

Next, as shown in FIG. 9(d), each of the support openings 34 is formed in the metal supporting board 18. At the same time, the supporting pad 50 is formed.

The support opening 34 and the supporting pad 50 are formed by, e.g., an etching method such as dry etching (e.g., plasma etching) or wet etching (e.g., chemical etching), drilling perforation, laser processing, or the like. Preferably, the support opening 34 is formed by wet etching.

Note that, simultaneously with the formation of the support opening 34 and the supporting pad 50, the metal supporting board 18 is trimmed to form the front portion 15, the wiring portion 16, and the rear portion 17.

Next, as shown in FIG. 9(e), the insulating base layer 28 exposed from the support opening 34 was partially removed.

The insulating base layer 28 is removed by, e.g., etching, or preferably wet etching or the like.

As a result, the lower side portion of the inner peripheral portion 36 of the insulating base layer 28 in each of the frame formation regions 49 is removed to form the second base opening 38. In addition, the insulating base layer 28 formed under the pattern insulating portion 52 is removed so that the entire lower surface of the piezoelectric-side terminal 40 is exposed from the first base opening 37. That is, the lower surface of the piezoelectric-side terminal 40 faces inside the second base opening 38 and the support opening 34.

Thus, in each of the pad portions 33, the piezoelectric-side terminal 40 is formed in the pattern indented in the thickness direction to fill the inner peripheral portion 36.

Thereafter, as shown in FIG. 9(f), the protective thin film 47 is formed over the surfaces of the front-side terminals 26 (see FIG. 1), the rear-side terminals 27 (see FIG. 1), the piezoelectric-side terminals 40, and the frame conductors 39 by, e.g., plating, or preferably electroless plating.

In this manner, the suspension board with circuit 3 is prepared (produced).

Next, as shown in FIGS. 1 and 2, the prepared suspension board with circuit 3, the support plate 2, and the piezoelectric elements 5 are assembled.

Specifically, the suspension board with circuit 3 is disposed on the upper surface of the support plate 2. That is, as shown in FIG. 1, the suspension board with circuit 3 is fixed to the support plate 2 by means of welding, an adhesive, or the like such that the first linear portion 20 of the wiring portion 16 traverses the widthwise middle portion between the plate openings 12, the first bent portion 21 thereof is disposed on the one widthwise end portion and front end portion of the rear plate portion 9, and the front portion 15 is disposed on the widthwise middle portion of the load beam portion 8 throughout the front-rear direction of the load beam portion 8.

Thereafter, as shown in FIG. 3, each of the piezoelectric elements 5 is fixed to the support plate 2, while the piezoelectric terminal 48 of the piezoelectric element 5 is electrically connected to the piezoelectric-side terminal 40.

To fix the piezoelectric element 5 to the support plate 2, the adhesive layers 31 are disposed on the attachment regions 13 of the actuator plate portion 6 and, via the adhesive layers 31, the both end portions of the piezoelectric element 5 in the front-rear direction are attached to the attachment regions 13. As shown in FIG. 1, the piezoelectric elements 5 are disposed in the plate openings 12 and on the both widthwise outsides of the first linear portion 20 of the suspension board with circuit 3 to be spaced apart therefrom.

Then, as shown in FIGS. 3 and 5, via the conductive adhesive 42, each of the piezoelectric-side terminals 40 of the suspension board with circuit 3 and the piezoelectric terminal 48 of the corresponding piezoelectric element 5 are electrically connected. Specifically, between the piezoelectric-side terminal 40 and the piezoelectric terminal 48, the conductive adhesive 42 is interposed and, by, e.g., heating the piezoelectric-side terminal 40, the piezoelectric terminal 48, and the conductive adhesive 42 to a relatively low temperature (specifically in a range of 100 to 200 C°), the piezoelectric-side terminal 40 and the piezoelectric terminal 48 are bonded together, while being electrically connected via the conductive adhesive 42.

The conductive adhesive 42 is a connecting medium (e.g., a conductive paste such as a silver paste) which exhibits an adhesive action by being heated at a relatively low temperature (in a range of, e.g., 100 to 200° C.). The connecting medium is composed of, for example, a conductive paste such as a silver paste, or low melting point metals such as eutectic alloys (tin alloys) including a tin-bismuth alloy and a tin-indium alloy. The connecting medium is preferably formed from a conductive paste.

The piezoelectric-side terminal 40 is electrically connected to the piezoelectric terminal 48 of the piezoelectric element 5 via the conductive adhesive 42 and also bonded to the piezoelectric terminal 48.

In addition, as shown in FIGS. 1 and 2, the slider 22 mounting thereon the magnetic head (not shown) is mounted on the gimbal 23 to electrically connect the magnetic head (not shown) and the front-side terminals 26.

Moreover, the read/write board (not shown) is electrically connected to the external terminals 27A, and the power source (not shown) is electrically connected to the power-source-side terminals 27B.

Furthermore, the drive coil (not shown) is attached to the base plate portion 7.

In this manner, the assembly 1 is obtained, and the obtained assembly 1 is mounted in the hard disk drive (not shown).

In the hard disk drive, the slider 22 of the assembly 1 circumferentially travels relative to a rotating hard disk in the form of a circular plate, while being floated over the surface of the hard disk with a minute gap being held therebetween. Meanwhile, the magnetic head (not shown) of the assembly 1 reads/writes information, while moving in the radial direction of the hard disk based on driving by the drive coil.

In addition, by the extension/contraction of the piezoelectric elements 5, the position of the magnetic head relative to the hard disk drive is accurately and finely adjusted.

That is, electricity is supplied from the power source (not shown) to one of the piezoelectric elements 5 via the power-source-side terminal 27B, the power-source wires 25B, and the piezoelectric-side terminal 40 and the voltage thereof is controlled so that the piezoelectric element 5 contracts. As a result, the front end portion of the rear plate portion 9 and the rear end portion of the front plate portion 10 in one widthwise end portion come closer to each other, while being flexibly supported on the flexible portion 11.

At the same time, electricity is supplied from the power source (not shown) to the other piezoelectric element 5 via the power-source-side terminal 27B, the power-source wires 25B, and the piezoelectric-side terminal 40 and the voltage thereof is controlled so that the piezoelectric element 5 extends. As a result, the front end portion of the rear plate portion 9 and the rear end portion of the front plate portion 10 in the other widthwise end portion go farther away from each other, while being flexibly supported on the flexible portion 11.

Consequently, the front plate portion 10 and the load beam portion 8 swing around the widthwise middle point of the front end portion of the rear plate portion 9 toward one widthwise side. At the same time, the suspension board with circuit 3 and the slider 22 which are fixed to the load beam portion 8 swing toward one widthwise side.

On the other hand, when one of the piezoelectric elements 5 is extended and the other piezoelectric element 5 is contracted, the front plate portion 10 and the load beam portion 8 swing in a direction opposite to the direction described above.

In the suspension board with circuit 3, each of the piezoelectric-side terminals 40 is formed in the pattern indented in the thickness direction. This allows a sufficient increase in the contact area between the piezoelectric-side terminal 40 and the conductive adhesive 42.

Therefore, it is possible to sufficiently improve the reliability of connection between the piezoelectric-side terminal 40 and the piezoelectric element 5.

Additionally, according to the producing method of the suspension board with circuit 3 shown in FIGS. 8 and 9, the insulating base layer 28 is formed on the metal supporting board 18 such that the piezoelectric-side-terminal formation regions 4 including the pattern opening portions 46 exposing the metal supporting board 18 in the pattern shape and the pattern insulating portions 52 defined by the pattern openings 46 are formed therein (see FIG. 8(b)).

Consequently, by then forming the piezoelectric-side terminals 40 in the piezoelectric-side-terminal formation regions 4 (see FIG. 8(c)) and subsequently forming the support openings 34 and the first base openings 37 which correspond to the piezoelectric-side-terminal formation regions 4 (see FIGS. 9(d) and 9(e)), each of the piezoelectric-side terminals 40 can be formed in the pattern exposed from the support opening 34 and the first base opening 37 and indented in the thickness direction.

Therefore, it is possible to save time and labor required in providing an extra step of performing a surface roughening treatment on the piezoelectric-side terminal 40 and also form the piezoelectric-side terminal 40 in the pattern indented in the thickness direction.

As a result, the suspension board with circuit 3 excellent in the reliability of connection with the piezoelectric elements 5 can be easily obtained at low cost.

Also, in the producing method of the suspension board with circuit 3 shown in FIGS. 8 and 9, the insulating base layer 28 is formed into the pattern formed with the piezoelectric-side-terminal formation regions 4 and the frame formation regions 49 through the gradation exposure of the photosensitive base coating, as shown in FIG. 8(b). However, it is also possible to, e.g., first form the planar insulating base layer 28 on the metal supporting board 18, and then form the insulating base layer 28 into the pattern described above by half etching using an etching resist or the like, though not shown.

Moreover, in the producing method of the suspension board with circuit 3 shown in FIGS. 8 and 9, the insulating base layer 28 is formed into the pattern formed with the piezoelectric-side-terminal formation regions 4 and the frame formation regions 49, as shown in FIG. 8(b), and the conductive layer 19 is subsequently formed, as shown in FIG. 8(c). Thereafter, the first base openings 37 and the second base openings 38 are formed in the insulating base layer 28, as shown in FIG. 9(e). However, it is also possible to, e.g., first form the planar insulating base layer 28 and the conductive layer 19 in succession on the metal supporting board 18, though not shown, then form the support openings 34 and the second base openings 38 respectively in the metal supporting board 18 and the insulating base layer 28, and form each of the piezoelectric-side terminals 40 in the conductive layer 19 exposed from the support opening 34 and the second base opening 38 into the pattern indented in the thickness direction by half etching using an etching resist or the like, as shown in FIGS. 9(d) and 9(e).

In the embodiment of FIGS. 1 and 2, the support plate 2 has been described as an integrated actuator-plate/load-beam plate integrally including the actuator plate portion 6 and the load-beam portion 8. However, as shown by the imaginary lines of FIGS. 1 and 2, it is also possible to provide a separating portion 51 therebetween, form the actuator plate portion 6 and the load-beam portion 8 as members separate from each other, and form the support plate 2 as a discrete actuator-plate/load-beam plate.

Figure 10:
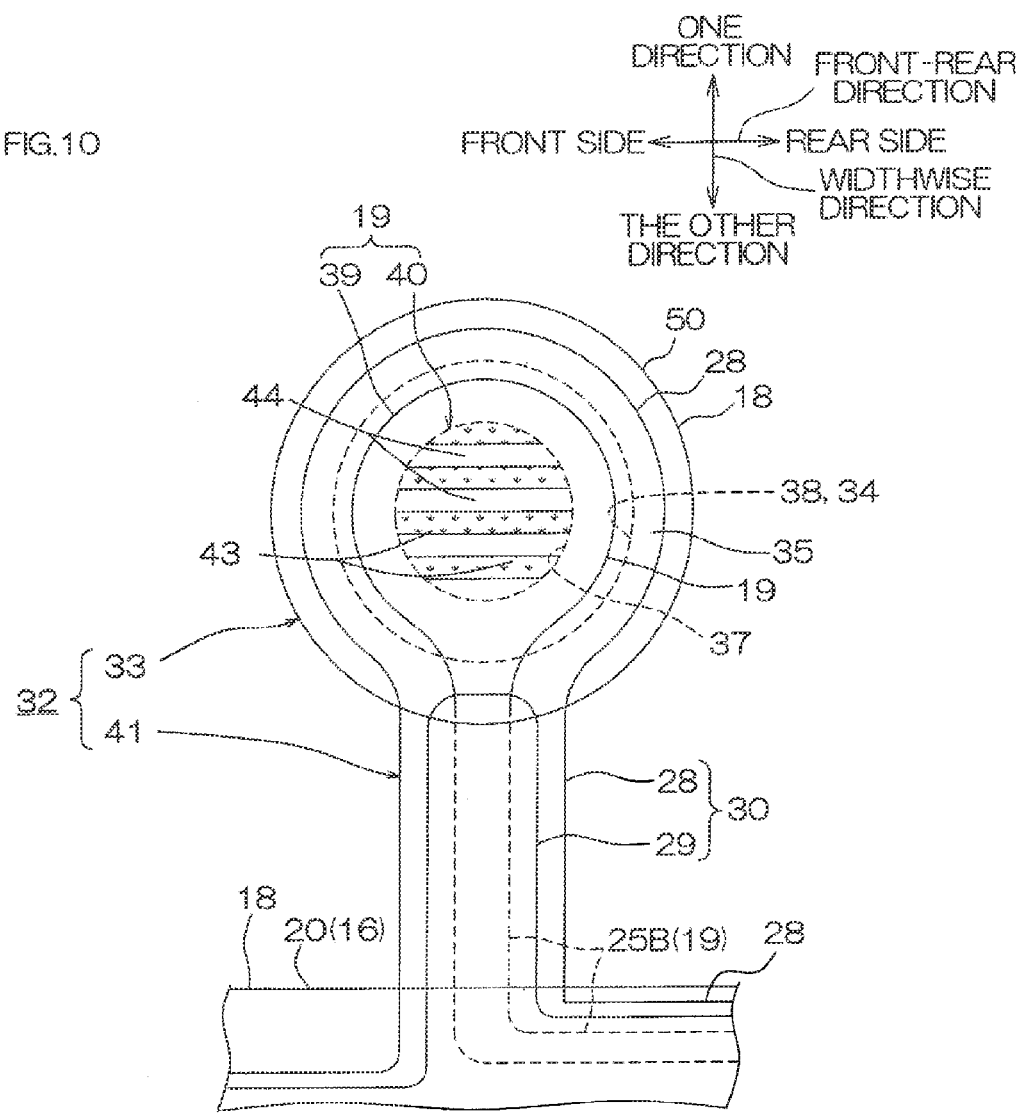
FIG. 10 shows an enlarged plan view of a pad portion (form in which a pattern has stripes extending in the front-rear direction) of a suspension board with circuit as another embodiment of the wired circuit board of the present invention.
Figure 11:
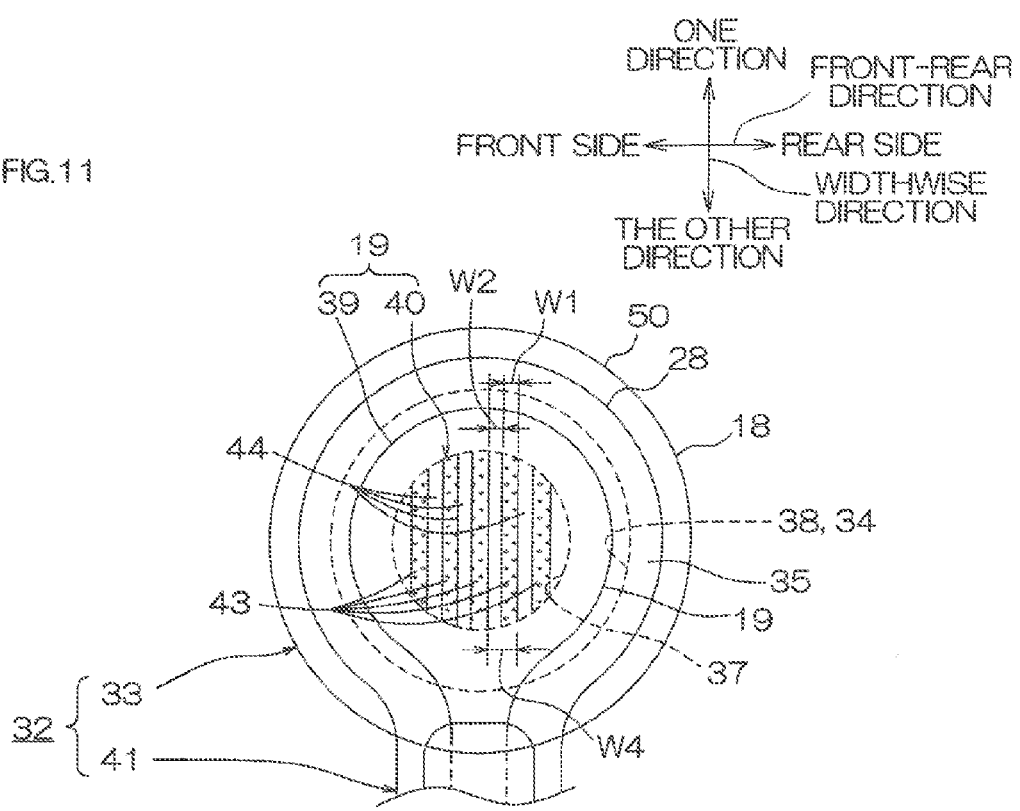
FIG. 11 shows an enlarged plan view of a pad portion (form in which the number of the upper walls is the same as the number of the lower walls) of a suspension board with circuit as still another embodiment of the wired circuit board of the present invention.
Figure 12:
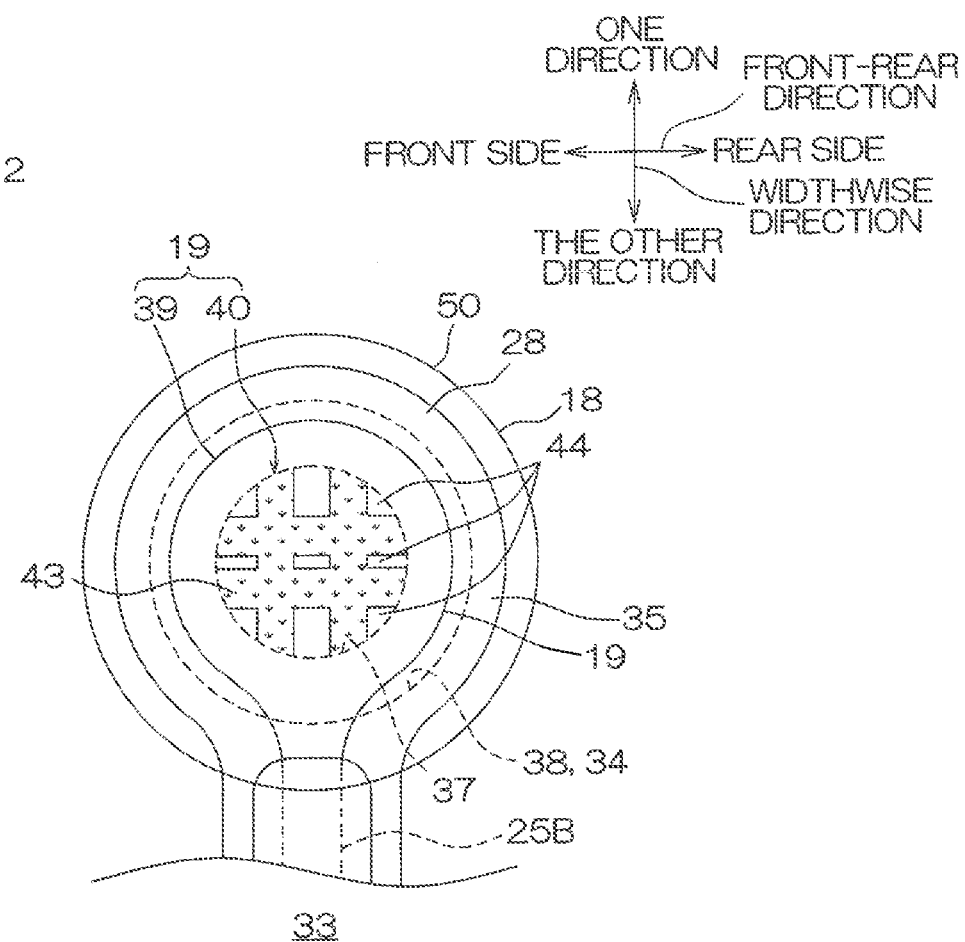
FIG. 12 shows an enlarged plan view of a pad portion (form in which a pattern has a generally grid-like plan view shape) of a suspension board with circuit as yet another embodiment of the wired circuit board of the present invention.
Figure 13:
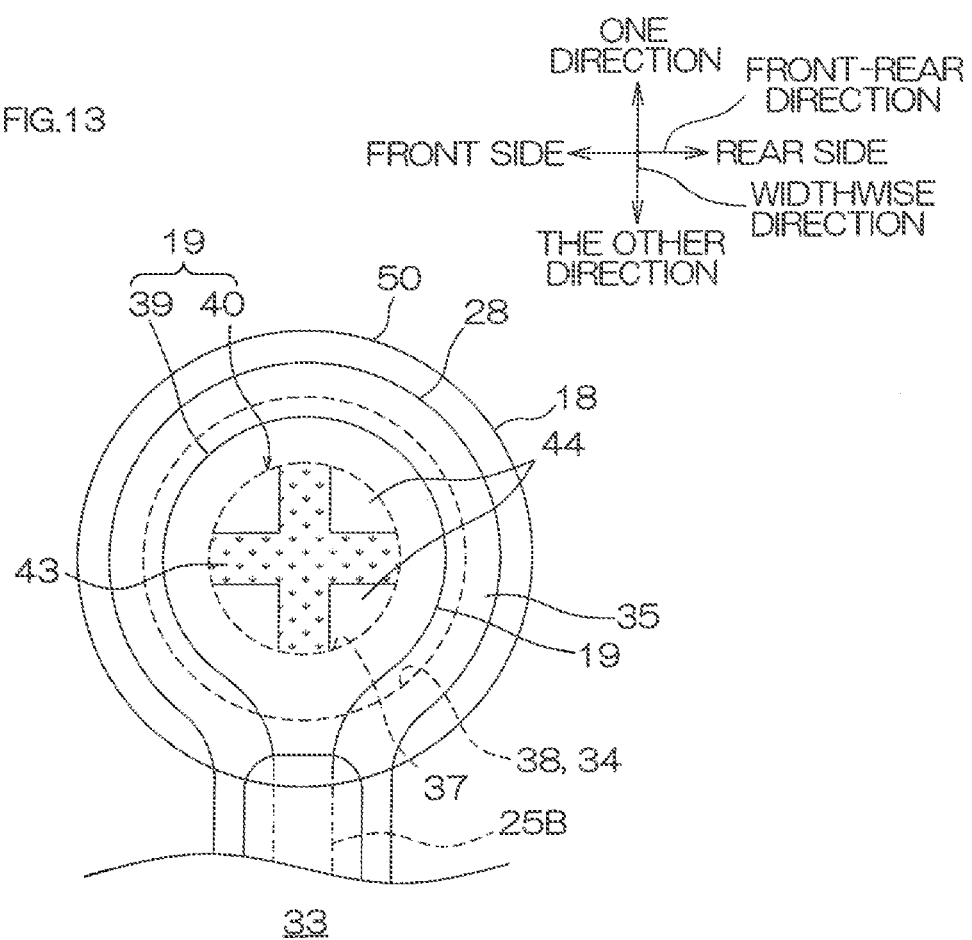
FIG. 13 shows an enlarged plan view of a pad portion (form in which a pattern has a generally crisscross plan view shape) of a suspension board with circuit as yet another embodiment of the wired circuit board of the present invention.
Figure 16:
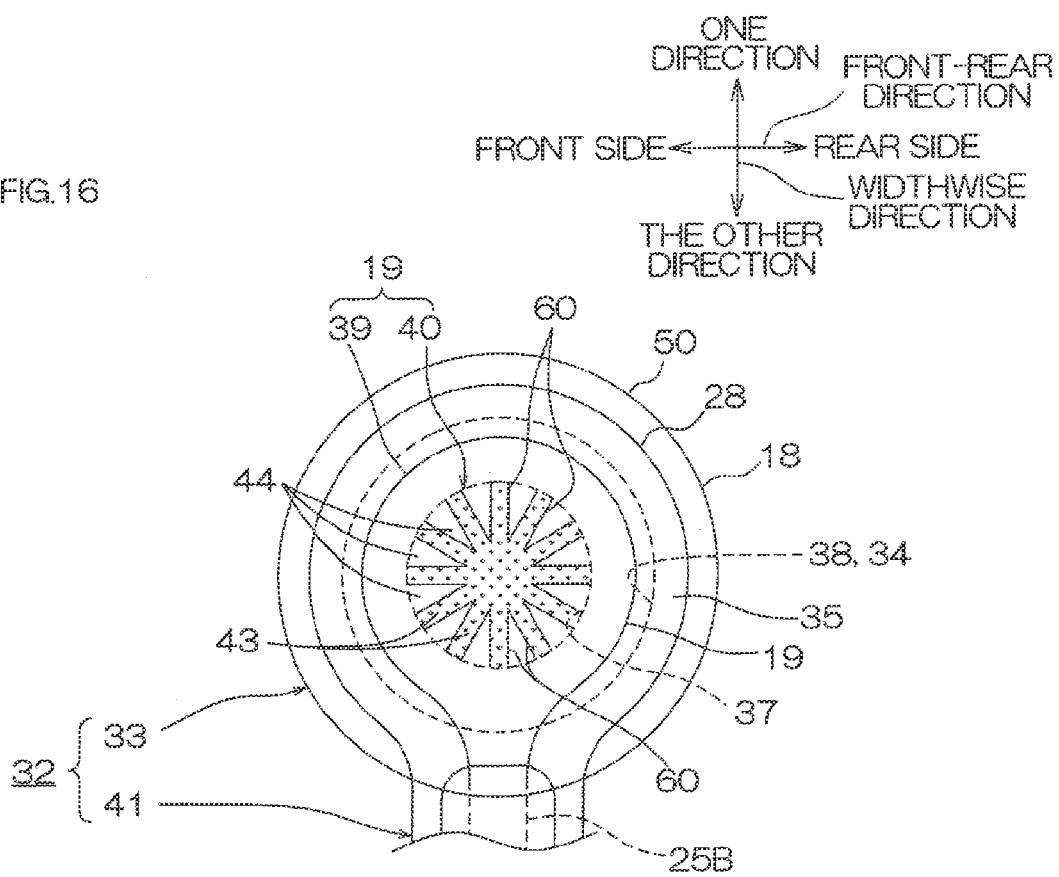
FIG. 16 shows an enlarged plan view of a pad portion (form in which a pattern has a generally spoke plan view shape) of a suspension board with circuit as another embodiment of the wired circuit board of the present invention.
Figure 24:
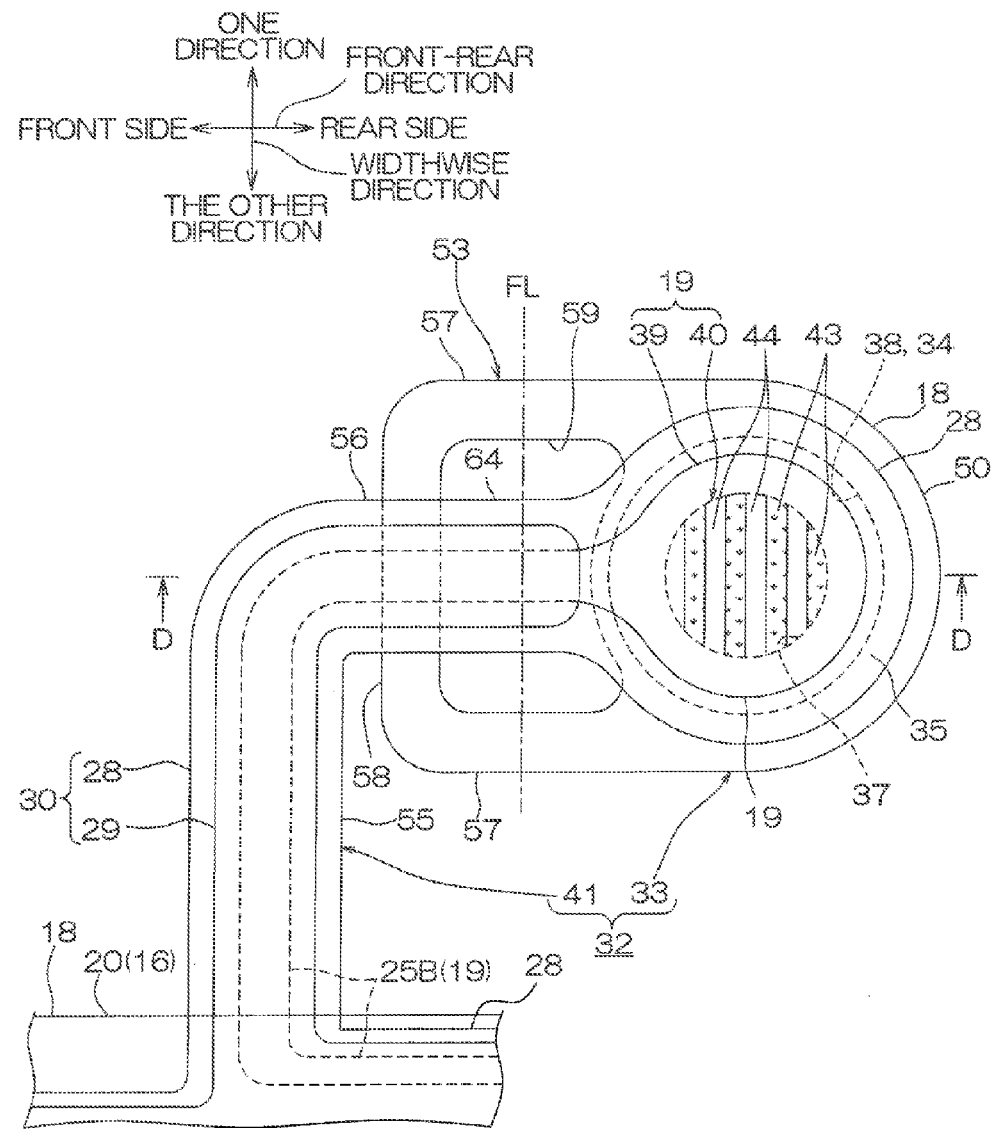
FIG. 24 shows an enlarged plan view of a joint portion of a suspension board with circuit as another embodiment of the wired circuit board of the present invention.
Figure 25:
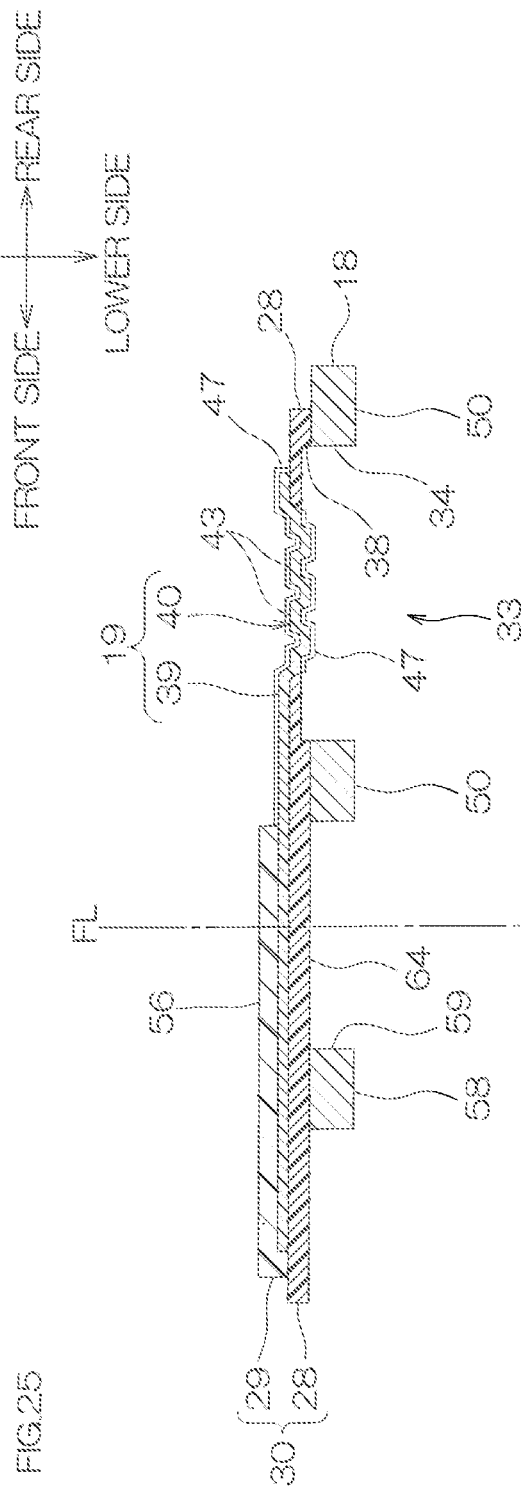
FIG. 25 shows a cross-sectional view along line D-D of the joint portion shown in FIG. 24.
Figure 26:
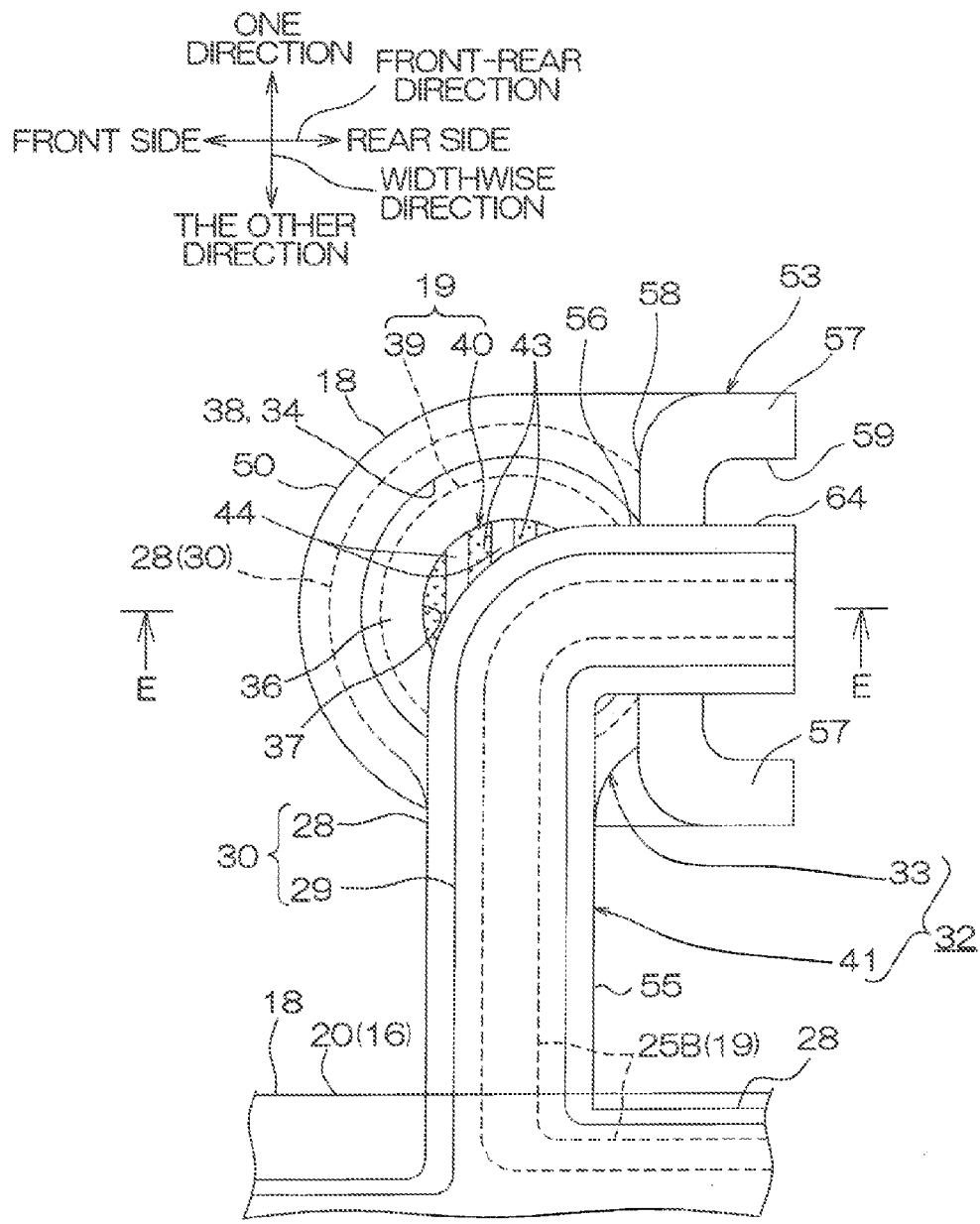
FIG. 26 shows an enlarged plan view after folding the pad portion of the joint portion shown in FIG. 24.
Figure 27:
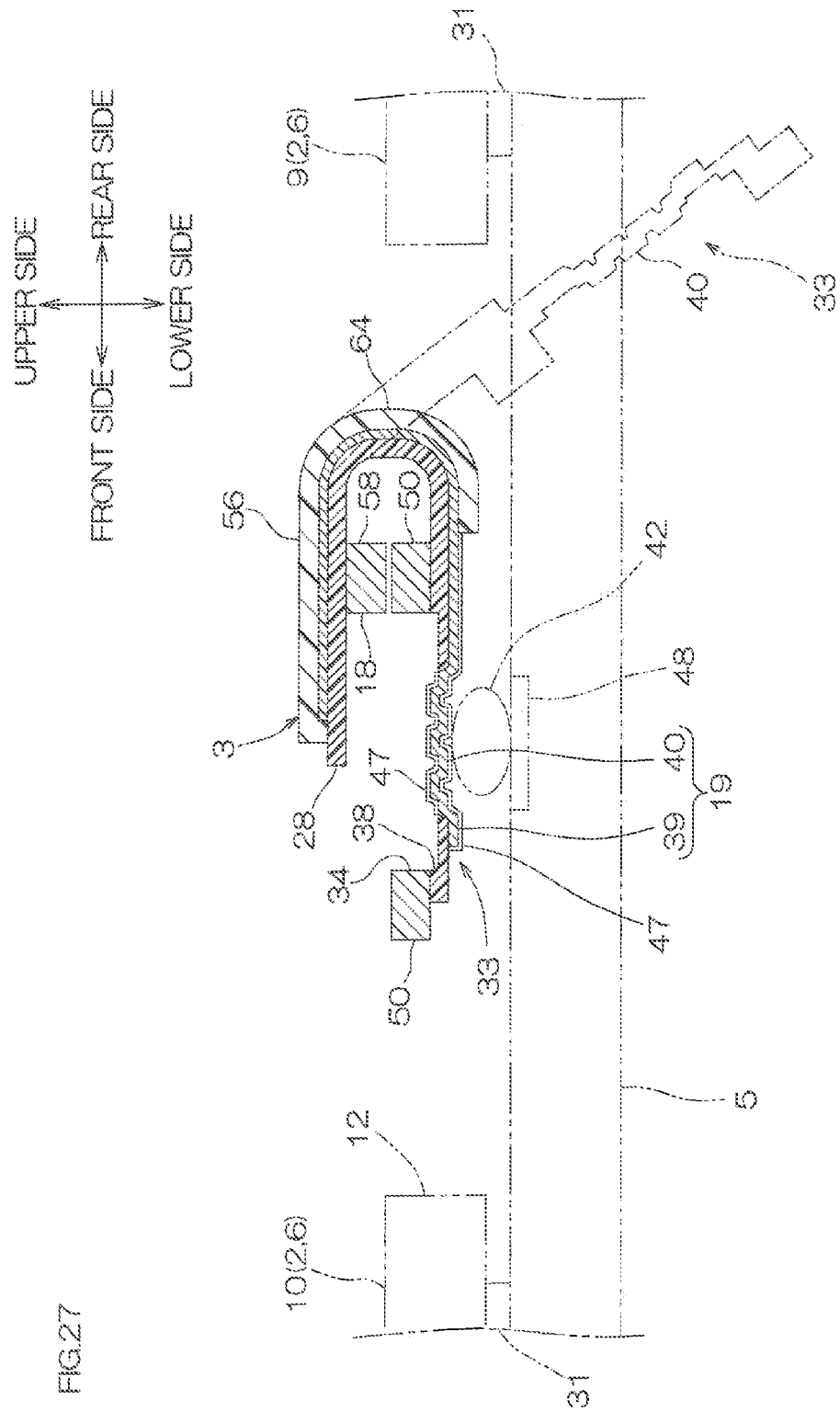
FIG. 27 shows a cross-sectional view along line E-E of the joint portion shown in FIG. 26.

FIG. 10 shows an enlarged plan view of a pad portion (form in which a pattern has stripes extending in the front-rear direction) of a suspension board with circuit as another embodiment of the wired circuit board of the present invention. FIG. 11 shows an enlarged plan view of a pad portion (form in which the number of the upper walls is the same as the number of the lower walls) of a suspension board with circuit as still another embodiment of the wired circuit board of the present invention. FIG. 12 shows an enlarged plan view of a pad portion (form in which a pattern has a generally grid-like plan view shape) of a suspension board with circuit as yet another embodiment of the wired circuit board of the present invention. FIG. 13 shows an enlarged plan view of a pad portion (form in which a pattern has a generally crisscross plan view shape) of a suspension board with circuit as still another embodiment of the wired circuit board of the present invention. FIG. 14 shows an enlarged plan view of a pad portion of a suspension board with circuit as another embodiment of the wired circuit board of the present invention, (a) illustrating a form in which a pattern has a generally annular plan view shape, and (b) illustrating a form in which a pattern has a generally spiral plan view shape. FIG. 15 is an enlarged plan view of a pad portion (a form in which a pattern is formed into a mark) of a suspension board with circuit as another embodiment of the wired circuit board of the present invention, (a) illustrating a form in which a pattern has a generally circular plan view shape, (b) illustrating a form in which a pattern has a generally rectangular plan view shape, (c) illustrating a form in which a pattern has a generally triangular plan view shape, (d) illustrating a form in which a pattern has a generally star-like plan view shape. FIG. 16 shows an enlarged plan view of a pad portion (form in which a pattern has a generally spoke plan view shape) of a suspension board with circuit as another embodiment of the wired circuit board of the present invention. FIG. 17 is an enlarged plan view of a pad portion (form in which a pattern has a generally scattered plan view shape) of a suspension board with circuit as another embodiment of the wired circuit board of the present invention, (a) illustrating a form in which each lower wall has a generally circular plan view shape, and (b) illustrating a form in which each lower wall has a generally rectangular plan view shape. FIG. 18 is an enlarged plan view of a pad portion (form in which a pattern has a generally wave plan view shape) of a suspension board with circuit as another embodiment of the wired circuit board of the present invention, (a) illustrating a form in which a pattern is along the widthwise direction, and (b) illustrating a form in which a pattern is along the front-rear direction. FIG. 19 shows an enlarged plan view of an embodiment in which in the pad portion shown in FIG. 17(b), patterns of the upper wall and the lower wall are interchanged. FIG. 20 shows a cross-sectional view of a pad portion (form in which the insulating cover layer is formed in the pad portion) of a suspension board with circuit as another embodiment of the wired circuit board of the present invention. FIG. 21 shows a cross-sectional view of a pad portion (form in which the metal supporting board is formed in a generally circular plan view shape) of a suspension board with circuit as another embodiment of the wired circuit board of the present invention. FIG. 22 is a process view illustrating a producing method of a suspension board with circuit as another embodiment of the wired circuit board of the present invention, (a) illustrating a step of forming an insulating base layer from a first insulating base layer and a second insulating base layer, (b) illustrating a step of forming a conductive layer, (c) illustrating a step of forming a support opening, (d) illustrating a step of forming a first base opening and a second base opening, and (e) illustrating a step of forming a protective thin film. FIG. 23 is an enlarged plan view of a pad portion (form in which the upper wall, the lower wall, and the connecting wall are formed into a fine indented pattern) of a suspension board with circuit as another embodiment of the wired circuit board of the present invention, (a) illustrating a step of forming a first base opening and a second base opening, (b) illustrating a step of forming a fine indented pattern in the piezoelectric-side terminal, and (c) illustrating a step of forming a protective thin film. FIG. 24 shows an enlarged plan view of a joint portion of a suspension board with circuit as another embodiment of the wired circuit board of the present invention. FIG. 25 shows a cross-sectional view along line D-D of the joint portion shown in FIG. 24. FIG. 26 shows an enlarged plan view after folding the pad portion of the joint portion shown in FIG. 24. FIG. 27 shows a cross-sectional view along line E-E of the joint portion shown in FIG. 26.

Note that, in each of the drawings mentioned hereinafter, members corresponding to the individual components described above are provided with the same reference numerals, and a detailed description thereof is omitted.

In the embodiment of FIGS. 10 to 19 to be described next, the lower walls 44 are formed in a pattern reverse to the upper walls 43.

In the embodiment of FIG. 6, the upper walls 43 and the lower walls 44 are each formed in a stripe (striped) pattern extending in the width direction, but the direction of the stripe is not particularly limited. For example, as shown in FIG. 10, the upper walls 43 and lower walls 44 can be formed in a pattern having stripes extending in the front-rear direction, or even not shown, can also be formed in a pattern having strips extending obliquely frontward (rearward) in the widthwise direction.

In the embodiment of FIG. 10, the plurality of upper walls 43 are disposed in parallel to be spaced apart in the widthwise direction. The upper walls 43 are formed so as to extend in the front-rear direction.

In the embodiment of FIG. 6, although the number of the upper walls 43 and the number of the lower walls 44 are set to be the same (the same number), for example, as shown in FIG. 11, for example, the numbers can be different from each other.

In the embodiment of FIG. 11, the number of the upper walls 43 are an odd number, and the number of the lower walls 44 are an even number. To be specific, the number of the upper walls 43 are 5, and the number of the lower walls 44 are 6.

Furthermore, for example, although not shown, the number of the upper walls 43 can be set to an even number, and the number of the lower walls 44 can be set to an odd number. Furthermore, the number of the upper walls 43 and the number of the lower walls 44 can be both set to even numbers, or can be both set to odd numbers.

In the embodiment of FIG. 6, although the number of the upper walls 43 and the number of the lower walls 44 are set to a plural number, for example, the number of the upper walls 43 and/or the number of the lower walls 44 can be set to a singular number.

Furthermore, in the embodiment of FIG. 6, the upper walls 43 and the lower walls 44 are each formed in a stripe (striped) pattern, but the shape of the pattern is not limited thereto. For example, as shown in FIGS. 12 to 19, the upper walls 43 can be formed in a pattern other than the stripe.

To be specific, for example, the upper walls 43 and the lower walls 44 are each can be formed, as shown in FIG. 12, in a pattern having a generally grid-like plan view shape. Alternatively, as shown in FIG. 13, the upper walls 43 and the lower walls can also be formed in a pattern having a generally crisscross plan view shape (generally + (plus) shape or generally X shape).

For example, the upper walls 43 and the lower walls 44 are each can be formed, as shown in FIG. 14, in (a) a generally annular (ring) plan view shape, and as shown in FIG. 14(b), can be formed in a generally spiral (whirl) plan view shape.

In the embodiment of FIG. 14 (a), the upper walls 43 and the lower walls 44 are formed alternately from the center of the piezoelectric-side terminal 40 outwardly in the radial direction. The lower wall 44 at the center is formed into a generally circular plan view shape.

In the embodiment of FIG. 14 (b), the upper walls 43 are formed into a generally spiral plan view shape (whirl shape) whirling clockwise from the center of the piezoelectric-side terminal 40 outward in the radial direction.

Furthermore, for example, the upper walls 43 can be formed, as shown in FIG. 15(a) to FIG. 15(d), at the center of the piezoelectric-side terminal 40, as a mark in plan view.

In the embodiment of FIG. 15(a) to FIG. 15 (d), the upper wall 43 is disposed to be spaced apart inside the frame conductor 39. To be specific, the upper wall 43 is connected to the frame conductor 39 through the lower wall 44.

In the embodiment of FIG. 15 (a), the upper wall 43 is formed into a generally circular plan view shape.

In the embodiment of FIG. 15 (b), the upper wall 43 is formed into a generally rectangular plan view shape.

In the embodiment of FIG. 15 (c), the upper wall 43 is formed into a generally triangular plan view shape.

In the embodiment of FIG. 15 (d), the upper wall 43 is formed into a generally star-like plan view shape.

In FIG. 15 (d), the upper wall 43 has five projected portions 61 extending radially from the center of the piezoelectric-side terminal 40. The projected portions 61 are formed into a generally triangular plan view shape with its circumferential direction length shortened gradually outward in the radial direction.

Furthermore, for example, as shown in FIG. 16, the upper wall 43 can be formed into a generally spoke plan view shape.

In the embodiment of FIG. 16, the upper wall 43 includes sixth linear portions 60 passing through the center of the piezoelectric-side terminal 40 and extending linearly toward the outer side in the radial direction from the center of the piezoelectric-side terminal 40. The plurality of sixth linear portions 60 are disposed in lines in a circumferential direction. That is, the plurality of sixth linear portions 60 are formed so as to extend radially from the center of the piezoelectric-side terminal 40.

Furthermore, as shown in FIG. 17(a) and FIG. 17(b), the pattern of the upper wall 43 can be formed into a generally scattered plan view shape.

In the embodiment of FIG. 17 (a), the plurality of upper walls 43 are disposed in lines to be spaced apart from each other in the planar direction, and the upper walls 43 are each formed into a generally circular plan view shape.

In FIG. 17 (*a*), the upper wall 43 includes a center portion 62 disposed at the center of the piezoelectric-side terminal 40, and a plurality of surrounding portions 63 disposed to be spaced apart from each other in the circumferential direction on the circumference of the center portion 62 with the center portion 62 as the center.

In the embodiment of FIG. 17 (*b*), the upper walls 43 are disposed in lines to be spaced apart from each other in the widthwise direction and the front-rear direction, and the upper wall 43 are each formed into a generally rectangular plan view shape.

The upper walls 43 can also be formed, for example, as shown in FIG. 18(*a*) and FIG. 18(*b*), a generally wave plan view shape.

In the embodiment of FIG. 18 (*a*), the plurality of upper walls 43 are disposed in lines to be spaced apart from each other in the front-rear direction, and the upper walls 43 are each formed into a sine wave (sine curve) shape extending (continuing) into the widthwise direction.

In the embodiment of FIG. 18 (*b*), the plurality of upper walls 43 are disposed in lines to be spaced apart from each other in the widthwise direction, and the upper walls 43 are each formed into sine wave (sine curve) shape extending (continuing) into the front-rear direction.

In the embodiments of FIGS. 10 to 18 also, the same operation/effect as achieved in the embodiment of FIG. 6 can be achieved.

In the embodiments of FIG. 10 to FIG. 18, the pattern of the upper wall 43 and the pattern of the lower wall 44 can be interchanged.

To be specific, in the embodiments of FIG. 12 and FIG. 13, the upper walls 43 are formed in the generally grid-like plan view shape and the generally crisscross plan view shape. However, the lower walls 44 can be formed in, e.g., a generally grid-like plan view shape and a generally crisscross plan view shape, though not shown.

Furthermore, in the embodiments of FIG. 15(*a*) to FIG. 15 (*d*), the upper wall 43 is formed into a mark. However, for example, the lower wall 44 can be formed into a mark, though not shown.

Furthermore, in the embodiment of FIG. 16, the upper wall 43 is formed into a generally spoke plan view shape. However, for example, the lower wall 44 can be formed into a generally spoke plan view shape, though not shown.

Furthermore, in the embodiments of FIG. 17(*a*) to 17(*b*), the upper wall 43 is formed into a generally scattered plan view shape. However, for example, the lower wall 44 can be formed into a generally scattered plan view shape.

To be specific, as shown in FIG. 19, the plurality of lower walls 44 are disposed in line to be spaced apart from each other in the planar direction (in particular, in the widthwise direction and the front-rear direction). The lower walls 44 are formed into a generally rectangular plan view shape.

The upper walls 43 are formed into a generally grid-like plan view shape extending in the front-rear direction and the widthwise direction so as to define the plurality of lower walls 44.

In FIG. 10 to FIG. 18, the same operation/effect as achieved therewith can be achieved in the embodiment in which the pattern of the upper walls 43 and the pattern of the lower walls 44 is interchanged (for example, including the embodiment of FIG. 19 in which the patterns in FIG. 17(*b*) are interchanged).

In the embodiments of FIGS. 3 and 6, the insulating cover layer 29 is not formed in the pad portions 33. However, for example, as shown by the imaginary lines of FIG. 4 and in FIG. 20, the insulating cover layer 29 can also be formed so as to cover the conductive layer 19.

In the embodiment shown by the imaginary lines of FIG. 4, the insulating cover layer 29 is formed in a pattern having a generally annular (ring) plan view shape and covering each of the frame conductors 39. That is, in the insulating cover layer 29, the cover openings 54 as the insulating openings extending therethrough in the thickness direction are formed to expose the upper surfaces of the piezoelectric-side terminals 40.

In the embodiment shown by the imaginary lines of FIG. 4, not only the same operation/effect achieved in the embodiment of FIGS. 3 and 6 is achieved, but also the frame conductors 39 can be supported on (reinforced by) the insulating cover layer 29. Therefore, it is possible to improve the mechanical strengths of the piezoelectric-side terminals 40 and improve the reliability of connection between the piezoelectric-side terminals 40 and the piezoelectric terminals 48.

In FIG. 20, the insulating cover layer 29 is formed on the upper surfaces and outer side surfaces of the frame conductors 39 and on the upper surfaces of the piezoelectric-side terminals 40.

In the embodiment of FIG. 20, not only the same operation/effect achieved in the embodiment of FIGS. 3 and 6 is achieved, but also the entire upper surfaces of the piezoelectric-side terminals 40 are supported by the insulating cover layer 29. Therefore, it is possible to improve the mechanical strengths of the piezoelectric-side terminals 40. This allows an improvement in the reliability of connection between the piezoelectric-side terminals 40 and the piezoelectric terminals 48.

On the other hand, in the embodiment of FIG. 3, the both sides of the piezoelectric-side terminals 40 are exposed. Therefore, in the connection between the piezoelectric-side terminals 40 and the piezoelectric terminals 48, ultrasonic connection or the like can also be used appropriately.

In the embodiments of FIGS. 3 and 7, in the metal supporting board 18 (supporting pad 50) in the pad portions 33, the support openings 34 are formed. However, as shown in FIG. 21, it is also possible to, e.g., form the metal supporting board 18 (supporting pad 50) in each of the pad portions 33 into a circular shape without forming the support openings 34 in the metal supporting board 18.

In FIG. 21, with the upper surface of the metal supporting board 18 (supporting pad 50), the lower surfaces of the pattern insulating portions 52 and the lower surfaces of the piezoelectric-side terminals 40 (that is, lower wall 44) with which the pattern openings 46 are filled are in contact.

Also, on the upper surfaces of the piezoelectric-side terminals 40, the conductive adhesive 42 (not shown in FIG. 21) is provided, and electrically connected to the piezoelectric elements 5 disposed thereon.

In the embodiment of FIG. 21, not only the same operation/effect achieved in the embodiment of FIGS. 3 and 6 is achieved, but also the piezoelectric-side terminals 40 are supported on the pattern insulating portions 52 and the metal supporting board 18. Therefore, it is possible to further improve the mechanical strength of each of the piezoelectric-side terminals 40 and thereby further improve the reliability of connection between the piezoelectric-side terminal 40 and the piezoelectric terminal 48.

Furthermore, in the embodiment of FIG. 1 and FIG. 3, the signal wires 25A and the power-source wires 25B are disposed in parallel in the widthwise direction in the wiring portion 16. However, for example, the signal wires 25A and the power-source wires 25B can be disposed to face each other in the thickness direction.

In such a case, as shown in FIG. 22 (a), the insulating base layer 28 can be formed from the first insulating base layer 71 and the second insulating base layer 72 formed thereon, and in the wiring portion 16 (not shown in FIG. 22 (a)), can be laminated in the sequence of the first insulating base layer 71, the power-source wires 25B, the second insulating base layer 72, signal wire 25A. Alternatively, they can be formed in the sequence of, the first insulating base layer 71, the signal wire 25A, the second insulating base layer 72, and the power-source wires 25B.

A method for producing such a suspension board with circuit 3 is described with reference to FIG. 22(a) to FIG. 22(e).

In this method, as shown in FIG. 8 (a), first, the metal supporting board 18 is prepared, and then as shown in FIG. 22(a), the insulating base layer 28 is formed on the metal supporting board 18.

To form the insulating base layer 28 on the metal supporting board 18, first, a first insulating base layer 71 is formed on the metal supporting board 18. To be more specific, the first insulating base layer 71 is formed into the same pattern as that of FIG. 8(b), that is, formed into a pattern in which a piezoelectric-side terminal formation region 4 and a frame formation region 49 are formed. The thickness of the first insulating base layer 71 is, for example, 0.5 to 50 μm, preferably 1.5 to 20 μm.

Next, power-source wires 25B or signal wires 25A, not shown, are formed on the first insulating base layer 71.

Next, the second insulating base layer 72 is formed on the first insulating base layer 71, so as to cover the power-source wires 25B or signal wires 25A, not shown. The second insulating base layer 72 is formed in the same pattern as that of the first insulating base layer 71. The thickness of the second insulating base layer 72 is, for example, 0.5 to 50 μm, or preferably 1.5 to 20 μm.

In this manner, the insulating base layer 28 composed of the first insulating base layer 71 and the second insulating base layer 72 are formed in the pattern in which the piezoelectric-side terminal formation region 4 and the frame formation region 49 are formed.

The thickness of the insulating base layer 28 (same as the total thickness of the first insulating base layer 71 and the second insulating base layer 72, and the thickness of the outer peripheral portion 35 of the frame formation region 49) is, for example, 8 to 60 μm, or preferably 8 to 30 μm.

In the insulating base layer 28, the thickness of the pattern insulating portion 52 is formed into the same thickness as that of the frame formation region 49.

Next, as shown in FIG. 22 (b), the conductive layer 19 (excluding the power-source wires 25B or the signal wires 25A) is formed on the upper surface of the insulating base layer 28 and on the upper surface of the metal supporting board 18 exposed from the pattern opening 46.

The distance L2 of the lower surface of the upper wall 43 and the lower surface of the lower wall 44 is longer than the distance L1 in the embodiment of FIG. 4, for example, 8 to 60 μm, or preferably 8 to 30 μm.

Next, as shown in FIG. 22 (c), the support opening 34 is formed in the metal supporting board 18.

Next, as shown in FIG. 22 (d), the insulating base layer 28 exposed from the support opening 34 is partially removed.

As a result, the lower side portion of the inner peripheral portion 36 of the insulating base layer 28 in each of the frame formation regions 49 is removed to form the second base opening 38.

The thickness of the inner peripheral portion 36 of the insulating base layer 28 is, for example, 0.5 to 50 μm, or preferably 1.5 to 20 μm.

Furthermore, the lower side portion of the pattern insulating portion 52 is removed. As a result, the lower side portion of the connecting wall 45 is exposed. That is, in the piezoelectric-side terminal 40, the lower wall 44 and the lower side portion of the connecting wall 45 face inside the second base opening 38 and the support opening 34.

On the other hand, at the indented portion 73 defined by the upper wall 43 and the upper side portion of the connecting wall 45, the upper side portion (for example, including the second insulating base layer 72 (see FIG. 22(a)), etc.) of the pattern insulating portion 52 remains. The thickness of the remaining pattern insulating portion 52 is, for example, 0.5 to 50 μm, or preferably 1.5 to 20 μm.

In this manner, at the pad portion 33, in the first base opening 37, the piezoelectric-side terminal 40 formed in a pattern which is indented in a thickness direction is formed.

Thereafter, as shown in FIG. 22 (e), the protective thin film 47 is formed on the surface of the piezoelectric-side terminal 40 and the frame conductor 39.

The protective thin film 47 at the lower side in the piezoelectric-side terminal 40 is formed so as to cover only the lower wall 44 and the lower side portion of the connecting wall 45.

In this manner, the suspension board with circuit 3 is prepared (produced).

In the embodiment of FIG. 22, the insulating base layer 28 is formed from two insulating base layers (the first insulating base layer 71 and the second insulating base layer 72) laminated in the thickness direction, and therefore to that extent, the heavy thickness of the insulating base layer 28 can be ensured sufficiently.

That is, as shown in FIG. 22 (e), the thickness of the outer peripheral portion 35 can be ensured with sufficient thickness, while ensuring the formation of the inner peripheral portion 36 thinner than the outer peripheral portion 35 in the pad portion 33.

Furthermore, in this embodiment, in the indented portion 73, a portion (upper side portion) of the pattern insulating portion 52 (insulating base layer 28) composed of synthetic resin, etc. remains, and therefore adhesiveness with the conductive adhesive 42 shown in the imaginary line in the FIG. 22(e), and provided thereafter can be improved.

Thus, the reliability of connection between the piezoelectric-side terminal 40 and the piezoelectric element 5 (see FIG. 3) can be sufficiently improved.

Furthermore, in the embodiment of FIG. 22, by forming the insulating base layer 28 from two insulating base layers laminated in the thickness direction, a portion of the pattern insulating portion 52 is allowed to remain in the indented portion 73. However, the layer structure of the insulating base layer 28 is not limited thereto, and for example, as shown in the embodiment of FIG. 22(a), in which the imaginary line is omitted, by forming the insulating base layer 28 from one insulating base layer to be relatively thick, a portion of the pattern insulating portion 52 can be allowed to remain in the indented portion 73.

In such a case, the thickness of (maximum thickness) of the insulating base layer 28 (including the outer peripheral portion 35) is, for example, 8 to 60 μm, or preferably 8 to 30 μm.

Furthermore, as shown in FIG. 23(b) and the FIG. 23 (c), the upper wall 43, the lower wall 44, and the connecting wall 45 in the piezoelectric-side terminal 40 each can also be formed in a indented pattern.

Furthermore, in the embodiments of FIG. 23(b) to 23(c), the upper wall 43, the lower wall 44, and the connecting wall 45 each is formed in a fine indented pattern compared with the indented pattern (the indented pattern based on the distance L1 of the upper wall 43 and the lower surface of the lower wall 44) in the piezoelectric-side terminal 40.

To form the above-described indented pattern in each of the upper wall 43, the lower wall 44, and the connecting wall 45, first, as shown in FIG. 23 (a), in the step of removing the insulating base layer 28, as shown in FIG. 9 (e), the piezoelectric-side terminal 40 formed in a pattern indented in a thickness direction is prepared, and thereafter, as shown in FIG. 23 (b), each of the upper wall 43, the lower wall 44, and the connecting wall 45 of the piezoelectric-side terminal 40 is formed in a fine indented pattern by, for example, microfabrication such as plasma treatment and laser treatment.

At the same time, on the surface of the frame conductor 39 as well, the fine indented pattern is formed.

The surface roughness Rz of the upper wall 43, the lower wall 44, and the connecting wall 45 is, for example, 50 to 2000 nm, or preferably 200 to 1000 nm. The surface roughness Rz is obtained as ten-point roughness in accordance with JIS B 0601-1994.

Thereafter, as shown in FIG. 23(c), the protective thin film 47 is formed on the surface of the piezoelectric-side terminal 40 and the frame conductor 39. On each of the surface of the protective thin film 47, a fine indented pattern in conformity with the fine indented pattern of the upper wall 43, the lower wall 44, and the connecting wall 45 is formed.

According to the embodiment of FIG. 23, the same operation/effect as achieved in the embodiment of FIGS. 6 and 7 can be achieved.

Also, according to the embodiment of FIG. 23, the fine indented pattern is formed on each of the upper wall 43, the lower wall 44, and the connecting wall 45, and therefore based on high anchor effect, reliability of connection between the piezoelectric element 5 and the piezoelectric terminal 48 (see FIG. 3) can be improved even more.

Furthermore, though not shown in FIG. 23, for example, the fine indented pattern can also be formed only at the lower surface, or at the upper surface of the piezoelectric-side terminal 40.

Though not shown, for example, when the fine indented pattern is not formed on the upper surface but formed on the lower surface of the piezoelectric-side terminal 40, as shown in FIG. 20, the insulating cover layer 29 is formed on the upper surface of the piezoelectric-side terminal 40.

Furthermore, for example, though not shown, when the fine indented pattern is not formed on the lower surface but formed on the upper surface of the piezoelectric-side terminal 40, as shown in FIG. 21, the upper surface of the metal supporting board 18 and the lower surface of the pattern insulating portion 52 are brought into contact with the lower surface of the lower wall 44.

Furthermore, as shown in FIG. 24 to FIG. 27, it is also possible to fold the pad portion 33 of the suspension board with circuit 3, and thereafter, the piezoelectric-side terminal 40 is electrically connected to the piezoelectric element 5.

In this embodiment, as shown in FIG. 24, in the connecting arm 32 before folding the pad portion 33, the joint portion 41 is formed in a generally L-shape in plan view.

The joint portion 41 integrally includes a second linear portion 55 and a second bent portion 56.

The second linear portion 55 is formed so as to extend from the center portion in the front-rear direction of the first linear portion 20 toward one side in the widthwise direction. The second linear portion 55 is formed in the same configuration as that of the joint portion 41 shown in FIG. 6. To be specific, the second linear portion 55 includes the insulating base layer 28, the power-source wires 25B, and the insulating cover layer 29.

The second bent portion 56 includes a supporting joint 53, an insulating base layer 28 supported by the supporting joint 53, power-source wires 25B, and an insulating cover layer 29.

The supporting joint 53 is formed as the same layer with the metal supporting board 18, and formed in a generally U-shape in plan view opening toward the rear side. To be specific, the supporting joint 53 integrally includes two third linear portions 57 extending toward the front side from the upper end portion and the lower end portion of the supporting pad 50 of the pad portion 33, and fourth linear portion 58 that connects the front end portions of the two third linear portions 57.

The third linear portions 57 and the fourth linear portion 58 are formed to have a width narrower than that of the second linear portion 55. To be specific, the width is for example, 20 to 200 μm, or preferably 30 to 100 μm.

In the metal supporting board 18 that forms the supporting joint 53 and the supporting pad 50, a joint opening 59 that extends through the metal supporting board 18 in the thickness direction is formed. The joint opening 59 is defined into a generally rectangular plan view shape, by the two widthwise inner surfaces (surfaces facing in the widthwise direction) of the third linear portions 57; the rear surface of the fourth linear portion 58; and the front surface of the supporting pad 50. In the second bent portion 56, the portion (insulating layer 30 and the power-source wires 25B) surrounded by the joint opening 59 in plan view is exposed from the metal supporting board 18, and therefore regarded as a fragile portion.

In this embodiment, to fold the pad portion 33 and to electrically connect the piezoelectric-side terminal 40 to the piezoelectric element 5, first, the pad portion 33 is folded toward the front end of the second bent portion 56 along the folding line FL shown in the one dot broken line of FIG. 24.

The folding line FL is formed in a straight line crossing the fragile portion 64 in the joint opening 59 in the widthwise direction.

To be specific, the pad portion 33 is folded, as shown in FIG. 24 and FIG. 25 so that the upper surface of the fragile portion 64 that folding line FL passes is the turning point (mountain fold). To be more specific, as shown in FIG. 26 and FIG. 27, the pad portion 33 is folded so that the front end portion (rear end portion in FIG. 25) of the supporting pad 50 and the fourth linear portion 58 are disposed to face (in close proximity) in the thickness direction.

In this manner, as shown in FIG. 26, the pad portion 33 including the piezoelectric-side terminal 40 is disposed so as to face at the lower side of the front end portion (one end portion in the widthwise direction of the second linear portion 55) of the second bent portion 56.

Thus, the piezoelectric-side terminal 40 overlaps with the plate opening 12 of the support plate 2 shown in the imaginary line when projected in the planar direction, as shown in FIG. 27. To be more specific, the piezoelectric-side terminal 40 is positioned in the plate opening 12.

Therefore, by the folding, the piezoelectric-side terminal 40 is brought into close contact with the piezoelectric terminal 48 of the piezoelectric element 5 to be connected later on.

Thereafter, through the conductive adhesive 42, the piezoelectric-side terminal 40 and the piezoelectric terminal 48 of the piezoelectric element 5 are electrically connected.

In the embodiment (particularly the embodiment shown in the imaginary line in FIG. 27) of FIG. 24 to FIG. 27, compared with the embodiment of FIG. 3, the piezoelectric-side terminal 40 and the piezoelectric terminal 48 of the piezoelectric element 5 are brought closer. Therefore, while decreasing the amount of the conductive adhesive 42 interposed therebetween, their adhesiveness can be improved sufficiently.

While the illustrative embodiments of the present invention are provided in the above description, such is for illustrative purpose only and it is not to be construed restrictively. Modification and variation of the present invention that will be obvious to those skilled in the art is to be covered by the following claims.

The invention claimed is:

1. A wired circuit board, comprising:
an insulating layer; and
a conductive layer including a wire covered with the insulating layer and a terminal, which is continued to the wire, for being electrically connected to an electronic element,
wherein the insulating layer is formed with an insulating opening exposing the terminal, and the terminal is formed in a pattern which is indented in a thickness direction so as to form a plurality of indented lower walls and at least one upper wall joined to the lower walls by connecting walls, to thereby increase a contact area between the terminal and a connecting medium for connecting the electronic element to the terminal,
wherein the connecting medium comprises a conductive adhesive,
wherein the terminal is used by electrically connecting to a terminal of the electronic element via the conductive adhesive, and
wherein the terminal of the wired circuit board is completely physically separated from the terminal of the electronic element by the conductive adhesive interposed therebetween.

2. The wired circuit board according to claim 1, wherein the insulating layer includes an insulating base layer formed at one side of the wire in the thickness direction, and
the insulating opening is formed so as to expose one-side surface of the terminal in the thickness direction in the insulating base layer.

3. The wired circuit board according to claim 2, further comprising:
a metal supporting board formed at one side of the insulating base layer in the thickness direction, and supported on a support plate to which the electronic element is attached,
wherein the metal supporting board is formed with a support opening exposing the one-side surface of the terminal in the thickness direction.

4. The wired circuit board according to claim 1, wherein the insulating layer includes an insulating cover layer formed at the other side of the wire in the thickness direction, and the insulating opening is formed so as to expose the other-side surface of the terminal in the insulating cover layer.

5. The wired circuit board according to claim 1, wherein the electronic element is a piezoelectric element.

6. The wired circuit board according to claim 1, wherein the pattern comprises a generally meandering shape in cross-section.

7. A method of producing a wired circuit board, comprising the steps of:
preparing a metal supporting board;
forming an insulating base layer at one side of the metal supporting board in a thickness direction thereof such that a terminal formation region including a pattern opening exposing the metal supporting board with a pattern shape and a pattern insulating portion defined by the pattern opening is formed therein;
forming a conductive layer such that the conductive layer includes a wire formed at side of the insulating base layer in the thickness direction and a terminal formed in the terminal formation region to be continued to the wire; and
forming a support opening and a base opening each corresponding to the terminal formation region respectively in the metal supporting board and the insulating layer to form the terminal into a pattern which is exposed from each of the support opening and the base opening and indented in the thickness direction so as to form a plurality of indented lower walls and at least one upper wall joined to the lower walls by connecting walls, to thereby increase a contact area between the terminal and a connecting medium for connecting an electronic element to the terminal,
wherein the connecting medium comprises a conductive adhesive,
wherein the terminal is used by electrically connecting to a terminal of the electronic element via the conductive adhesive, and
wherein the terminal of the wired circuit board is completely physically separated from the terminal of the electronic element by the conductive adhesive interposed therebetween.

* * * * *